(12) United States Patent
Farhang Boroujeny et al.

(10) Patent No.: US 7,848,440 B2
(45) Date of Patent: *Dec. 7, 2010

(54) MULTI-CHANNEL COMMUNICATION METHOD AND APPARATUS USING PLURAL MARKOV CHAIN MONTE CARLO SIMULATIONS

(75) Inventors: Behrouz Farhang Boroujeny, Salt Lake City, UT (US); Peiman Amini, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 1066 days.

This patent is subject to a terminal disclaimer.

(21) Appl. No.: 11/593,899

(22) Filed: Nov. 6, 2006

(65) Prior Publication Data

US 2007/0076669 A1    Apr. 5, 2007

Related U.S. Application Data

(63) Continuation-in-part of application No. 11/177,938, filed on Jul. 7, 2005, now Pat. No. 7,457,367.

(60) Provisional application No. 60/734,665, filed on Nov. 7, 2005.

(51) Int. Cl.
*H04L 5/12*    (2006.01)
*H04L 23/02*   (2006.01)

(52) U.S. Cl. ................... 375/262; 375/144; 375/341; 370/252; 370/338

(58) Field of Classification Search ......... 375/259–262, 375/316, 340–341; 704/200, 231, 251, 255, 704/256; 370/252, 338
See application file for complete search history.

(56) References Cited

U.S. PATENT DOCUMENTS 6,725,025 B1   4/2004   Schmidl et al.
7,076,000 B2   7/2006   Rodriguez (Continued)

OTHER PUBLICATIONS

Markus Dangl, Zhenning Shi, Mark C. Reed and Jurgen Lindner, "Advanced Markov Chain Monte Carlo Methods for Iterative (Turbo) Multiuser Detection," *4th International Symposium on Turbo Codes and Related Topics*, Munich, Germany, Apr. 2006.

(Continued)

*Primary Examiner*—David C Payne
*Assistant Examiner*—James M Perez
(74) *Attorney, Agent, or Firm*—Kirton & McConkie; William T. Ralston

(57) ABSTRACT

A technique for estimating channel data probability in a multi-user or multiple-input multiple-output communication system is disclosed. The technique uses parallel Markov Chain Monte Carlo simulation to select a plurality of hypothetical channel data patterns. Channel data bit probabilities are obtained by summing conditional bit probabilities, where the conditional bit probabilities are conditioned on an observation of the multi-channel signal and the hypothetical channel data patterns.

18 Claims, 10 Drawing Sheets

U.S. PATENT DOCUMENTS

| | | |
|---|---|---|
| 2002/0110206 A1 | 8/2002 | Becker et al. |
| 2004/0010399 A1* | 1/2004 | Kadane et al. ............... 703/2 |
| 2004/0014445 A1 | 1/2004 | Godsill et al. |
| 2004/0161059 A1* | 8/2004 | Andrieu ............... 375/341 |
| 2004/0174939 A1 | 9/2004 | Wang |
| 2005/0105682 A1* | 5/2005 | Heumann et al. ............ 378/58 |
| 2006/0023636 A1 | 2/2006 | Farhang-Boroujeny et al. |

OTHER PUBLICATIONS

Yang et al., "Turbo Equalization for GMSK Signaling Over Multipath Channels based on the Gibbs Sampler", IEEE, Sep. 2001.

Wu et al., "Bayesian Multiuser Detection for CDMA System with Unknown Interference", IEEE, May 2003.

Djuric et al. "Perfect Sampling: A Review and Applications to Signal Processing", Feb. 2002.

Wang, Xiaodong et al. "Monte Carlo Bayesian Signal processing for Wireless Communications" Journal of VLSI Signal Processing, 2002 pp. 89-105, vol. 30, Netherlands.

Wang, Xiaodong et. "Iterative (Turbo) Soft Interference Cancellation and Decoding for Coded CDMA" IEEE Transactions on Communications, 1999, pp. 1046-1061, vol. 47, No. 7.

Huang, Yufei et al. "Multiuser Detection of Synchronous Code-Division Multiple-Access Signals by Perfect Sampling" IEEE Transactions on Communications, 2002, pp. 1724-1734, vol. 50, No. 7.

Chen, Rong et al. "Convergence Analyses and Comparisons of Markov Chain Monte Carlo Algorithms in Digital Communications" IEEE Transactions on Signal Processing, 2002, pp. 255-270, vol. 50, No. 2.

Wang, Xiaodong et al. "Adaptive Bayesian Multiuser Detection for Synchronous CDMA with Gaussian and Impulsive Noise" IEEE Transactions on Signal Processing, 2000, pp. 2013-2028, vol. 47, No. 7.

Wang, Xiaodong et al. "Blind Turbo Equalization in Gaussian and Impulsive Noise" IEEE Transactions on Vehicular Technology, 2001, pp. 1092-1105, vol. 50, No. 4.

PCT/US2006/048914: International Search Report and Written Opinion of the International Searching Authority.

* cited by examiner

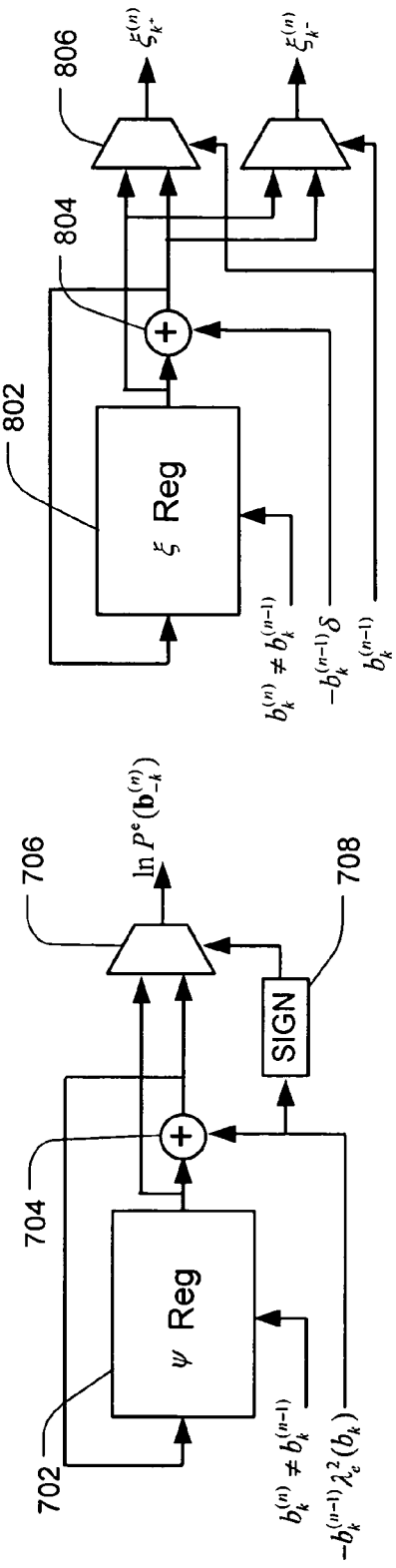
FIG. 7
FIG. 8
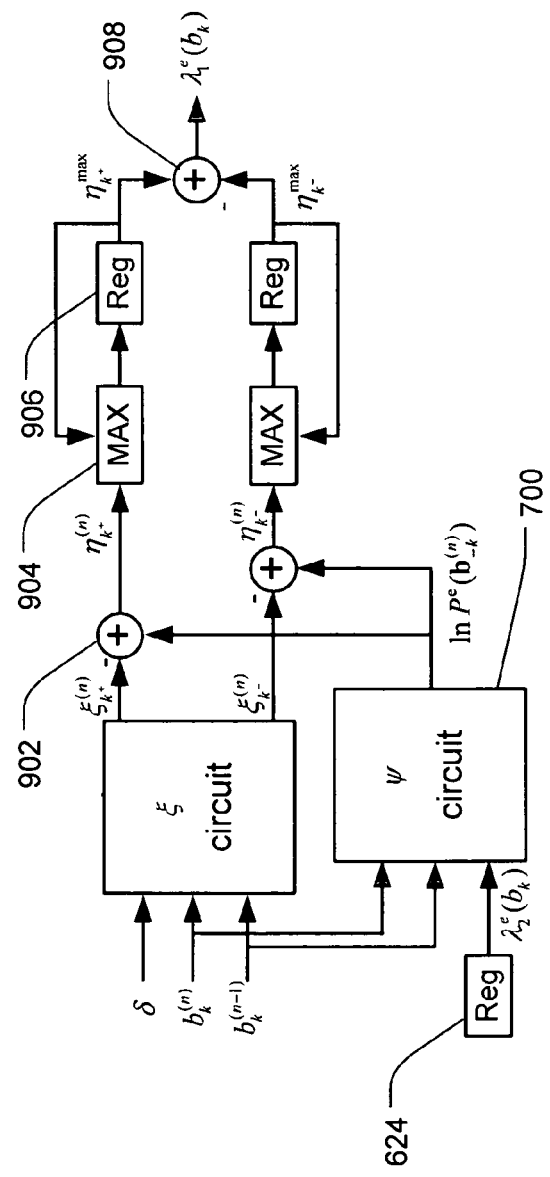
FIG. 9

MULTI-CHANNEL COMMUNICATION METHOD AND APPARATUS USING PLURAL MARKOV CHAIN MONTE CARLO SIMULATIONS

This application claims the benefit of U.S. Provisional Patent Application Ser. No. 60/734,665 filed Nov. 7, 2005, entitled "Multi-Channel Communication Method and Apparatus Using Plural Markov Chain Monte Carlo Simulations" and is also a continuation in part of co-pending U.S. application Ser. No. 11/177,938 filed Jul. 7, 2005, entitled "Detector and Method for Estimating Data Probability in a Multi-Channel Receiver," each of which is hereby incorporated by reference.

BACKGROUND OF THE INVENTION

1. Field of the Invention

The present invention relates generally to wireless communication. More particularly, the present invention relates to techniques for joint detection of multiple-input multiple-output (MIMO) and multi-user code division multiple access (CDMA) signals.

2. Related Art

Wireless communications have become ubiquitous. Improving the performance and capacity of wireless communications systems is highly desirable.

Many wireless communications systems make use of code division multiple access (CDMA) to enable multiple users to share a common frequency bandwidth. CDMA can provide high capacity in some wireless systems, including for example, cellular networks. In CDMA, users' transmissions are encoded with spreading codes. Ideally, spreading codes for different users allow the transmissions for different users to be separated without interference. In practice, some interference ("multi-user interference") occurs, which can be eliminated by various multi-user detection algorithms, including for example, interference cancellation. Performance of interference cancellers has sometimes provided limited performance, in part due to errors in estimating the interference caused between users.

Improved interference cancellation techniques have been developed that use iterative processing. The typical iterative approach uses the output of the interference canceller to estimate user data symbols, which are fed back into the interference canceller to provide improved cancellation of interference and successively refined estimates of the user symbols. This typical approach, however, suffers from various problems, including no guarantee of convergence, and suboptimal performance. Other known approaches frequently realize only a fraction of the potential channel capacity.

An alternate approach to dealing with multi-user interference is to perform joint demodulation of the multiple users. For example, maximum likelihood sequence estimation (MLSE) may be performed which accounts for both multi-user interference and symbol-to-symbol memory introduced by forward error correction (FEC) encoding. Although MLSE can provide excellent performance, MLSE is prohibitively complex when there are a large number of users since the complexity of MLSE grows exponentially with the number of users. One method that avoids this exponential complexity, yet results in the same performance as MLSE, is minimum mean square error (MMSE) detector with soft cancellation as described by X. Wang and H. V. Poor, "Iterative (Turbo) Soft Interference Cancellation and Decoding for Coded CDMA", IEEE Trans. Commun., vol. 47, no. 7, pp. 1046-1061, July 1999, and herein incorporated by reference.

A K user system may, in general, require inversion of a K-by-K matrix for each user symbol and for each iteration. Hence, the processing complexity of suboptimum receivers can be of the order of $K^3$. Although some simplification of the processing can be obtained using iterative steps, such approaches still require processing complexity of the order of $K^2$ or greater per each user symbol for each iteration. Hence industry has continued to search for improved multi-user detection techniques.

New wireless communications techniques, such as multiple-input multiple-output (MIMO), are also being introduced which have the potential to provide high capacity. In MIMO, multiple antennas at a transmitter are used, where different symbols may be transmitted on each antenna, providing increased capacity. Multiple antennas at the receiver are typically used, to allow the separation of the symbols from each transmit antenna. Theoretically, MIMO channels can provide capacity which increases linearly with the number of antennas. Interference between the different symbols from different antennas, however, sets limits on practical application of MIMO. Hence, handling interference becomes an important aspect of achieving the potential capacity of a MIMO system.

SUMMARY OF THE INVENTION

It has been recognized that it would be advantageous to develop techniques that provide good performance in the presence of multi-channel interference such as that present in CDMA and MIMO systems.

The invention includes a method for estimating channel data bit probabilities of a multi-channel signal received through a communication channel. The method may include summing a conditional bit probability to obtain a channel data bit probability summation. The conditional bit probability may be conditioned on an observation of the multi-channel signal and a hypothetical channel data pattern. The summation may be performed over a subset of hypothetical channel data patterns. The method may include selecting the hypothetical channel data patterns using multiple Markov chain Monte Carlo simulations to stochastically select the subset of hypothetical channel data patterns. The hypothetical channel data patterns may be selected to correspond to dominant conditional bit probability terms in the channel data bit probability summation. The Markov chain Monte Carlo simulations can be initialized so that at least two of the Markov chain Monte Carlo simulations are initialized using different approaches. This can help to improve the performance of the method, resulting in reduced bit error rate.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

FIG. 7 is a circuit diagram of a ψ-calculator circuit in accordance with an embodiment of the present invention;

FIG. 8 is a circuit diagram of a ξ-calculator circuit in accordance with an embodiment of the present invention; and FIG. 9 is a circuit diagram of a log-likelihood calculator circuit in accordance with an embodiment of the present invention;

DETAILED DESCRIPTION

Figure 1:
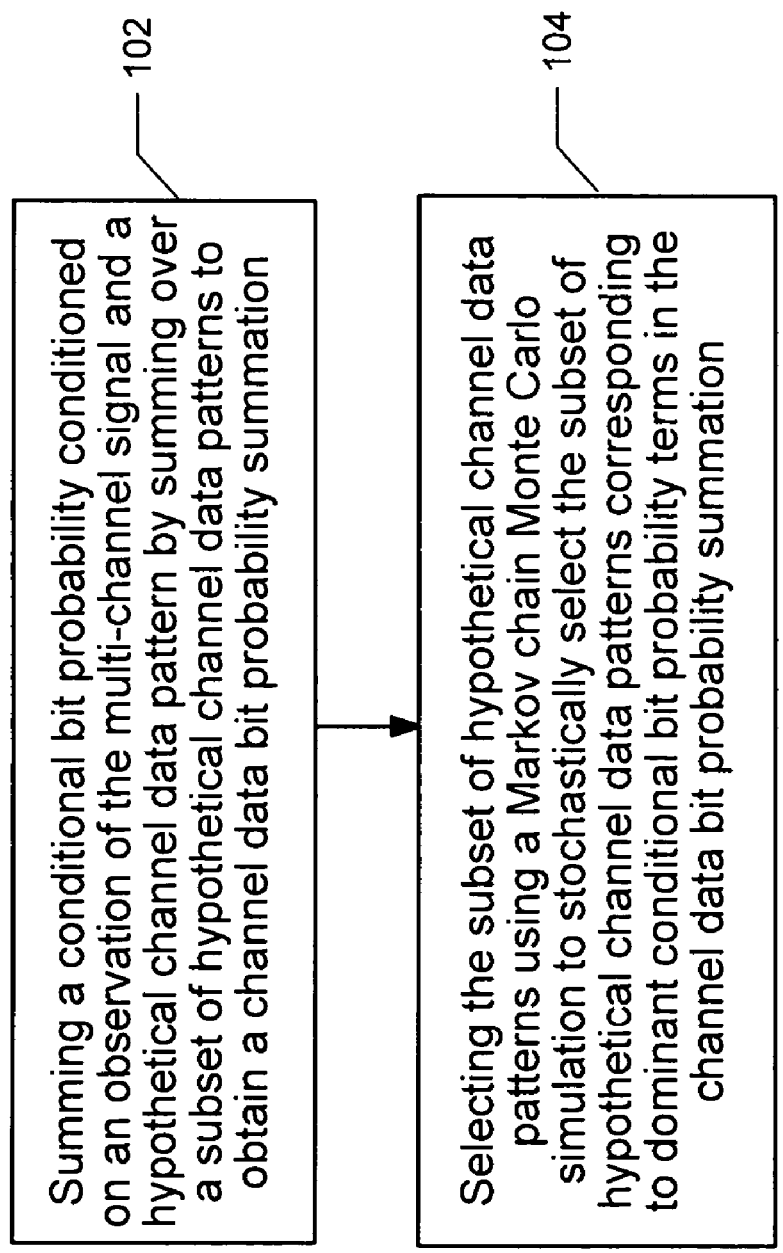
FIG. 1 is flow chart of a method for estimating channel data bit probabilities of a multi-channel signal received through a communication channel in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

The following notations are adhered to throughout this application. Vectors are denoted by lowercase bold letters. Matrices are denoted by uppercase bold letters. The ij-th element of a matrix, say, A is denoted by $a_{ij}$. The superscripts $^T$ and $^H$ are used to denote matrix or vector transpose and Hermitian, respectively. Integer subscripts are used to distinguish different channels. Integer time indices are put in brackets. For example, $d_k(i)$ is used to denote the i th symbol of the channel k. In most expressions, the time index, i, is omitted for brevity. The notations $P(\cdot)$ and $p(\cdot)$ denote the probability of a discrete random variable and the probability density of a continuous random variable, respectively.

One aspect of the presently disclosed inventive techniques involves recognizing that a MIMO communication system resembles a CDMA system. The data streams transmitted at each MIMO antenna are thus analogous to users in a CDMA system, and the channel gains between each transmit antenna and the receive antennas is a vector analogous to a spreading codes of a CDMA user. Accordingly, the number of receive antennas plays the same role as the spreading gain, N, in a multi-user system, and the number of transmit antennas plays the same role as the number of users, K. Hence, the methods developed for multi-user detection can be immediately applied to a MIMO system with K transmit and N receive antennas. K/N can thus be referred to as the system load, and the MIMO channel is thus referred to as "under-loaded" when K<N, "fully loaded" when K=N, and "over-loaded" when K>N. Accordingly, throughout this application the term "multi-channel" is used in a general sense to refer to both CDMA and MIMO systems. Within a multi-user CDMA system, for example where individual users are each encoded with a different spreading code, the term channel refers to an individual user within a composite CDMA signal. Within a MIMO system, for example where different data streams are transmitted by transmit antennae, the term channel refers to a particular data stream transmitted on one antenna; such a channel may correspond to one or more users. Of course, variations and combinations of these basic types of systems can also be used for which the disclosed inventive techniques are equally applicable.

A multi-channel CDMA or MIMO communication system with K channels will now be described in general terms. For simplicity, it is assumed that the channels are synchronous, although this is not be essential. Each channel has a spreading sequences of length N, i.e., a spreading gain of N. Using $d(i)=[d_1(i) d_2(i) \ldots d_K(i)]^T$ to denote data symbols transmitted by the K channels in the $i^{th}$ time slot and A(i) to denote the matrix containing spreading code (scaled with the channel gain) of the $k^{th}$ channel in its $k^{th}$ column, the received signal vector, is given by $$y(i)=A(i)d(i)+n(i) \quad (1)$$

where n(i) is the channel additive noise. The received signal may be sampled at a chip rate or another convenient rate.

For simplicity, it is assumed in the derivation that the samples of n(i) are zero-mean, independent, and identically distributed and $E[n(i)n^H(i)]=\sigma_n^2 I$. In practice, noise frequently deviates slightly from this assumption without substantially degrading the performance of communication systems. Data symbols are transmitted and decoded in blocks of length M and for each block the time index i takes the values of 1 to M. Various block sizes will be suitable depending upon the communication system application.

As most receivers include forward error correction decoding, an estimate of the data log-likelihood ratio (LLR) is used, given by $$\lambda_1(d_k(i)) = \ln \frac{P(d_k(i) = +1|y(i), \lambda_2^e(i))}{P(d_k(i) = -1|y(i), \lambda_2^e(i))}, \quad (2)$$

where $\lambda_2^e(i)$ is extrinsic information provided by a forward error correction decoder, when present, as discussed further below. Estimating the values of $\lambda_1(d_k(i))$ in a computationally efficient manner is a significant benefit of the presently disclosed inventive techniques. For example, note that $$P(d_k(i) = +1|y(i)) \quad (3)$$
$$= \sum_{d_{-k}(i)} P(d_k(i)$$
$$= +1, d_{-k}(i)|y(i))$$
$$= \sum_{d_{-k}(i)} P(d_k(i)$$
$$= +1|y(i), d_{-k}(i))P(d_{-k}(i)|y(i)),$$

where the second identity follows by applying the chain rule, $d_{-k}(i)=[d_1(i) \ldots d_{k-1}(i) d_{k+1}(i) \ldots d_K(i)]^T$ and the summation is over all possible values of $d_{-k}(i)$. The number of combinations that $d_{-k}(i)$ can take grows exponentially with K Direct calculation of the data log likelihood ratio thus becomes prohibitive for large values of K.

The complexity of the summation of (3) can be reduced by using MCMC simulation to select a subset of terms for which the summation is performed. A first method which can help to avoid prohibitive complexity will now be described. FIG. 1 illustrates a flow chart of a method, shown generally at 100, for estimating a channel data bit probability, e.g. $P(d_k(i)=+1|y(i))$, of a multi-channel signal received through a communication channel. The method includes summing 102 a conditional bit probability, e.g. $P(d_k(i)=+1|y(i), d_{-k}(i))$, conditioned on an observation of the multi-channel signal, e.g. $y(i)$, and a hypothetical data pattern, e.g. $d_{-k}(i)$ to obtain a channel data bit probability summation. Rather than summing the conditional bit probability over all possible data patterns, the summation is performed over a subset of the hypothetical data patterns, e.g. $d_{-k}(i)$ Hence, the method includes selecting 104 the subset of data patterns corresponding to dominant conditional bit probability terms in the channel data bit probability summation. In other words, the summation is performed substantially over terms where the conditional probability is significant, and terms where the conditional probability is significant are substantially omitted.

The selection of hypothetical channel data patterns can be performed using a Markov chain Monte Carlo (MCMC) simulation to stochastically select the subset of data patterns corresponding to dominant conditional bit probability terms in the channel data bit probability summation. By summing a subset of data patterns corresponding to the dominant terms, rather than summing over all possible data values, a significant reduction in the processing can be obtained relative to an exact calculation of the channel data bit probability summation. The MCMC simulation helps to ensure that the subset of data patterns selected correspond to the dominant terms. Dominant terms are those terms in the summation that are relatively large and thus have correspondingly greater impact on the summation than terms that are relatively small. A significant benefit of the method is the ability to obtain an accurate estimate of the channel data bit probability from a relatively small subset of hypothetical channel data patterns, by including primarily dominant terms in the summation. An additional benefit of the method is improved accuracy of the channel data probability estimates relative to some prior art approaches which do not perform probability summations.

Of course, because the conditional probability summation can be normalized, it is not essential that all of the dominant terms are included, or that all non-dominant terms are excluded, in order to obtain a good estimate of the channel data bit probability. The MCMC simulation, being a stochastic process, will neither precisely select all the largest terms nor exclude all the smallest terms. Instead, the MCMC simulation helps to ensure that most of the hypothetical data patterns included in the summation are dominant terms.

In order to describe in further detail how the MCMC simulation may be used to select dominant conditional bit probability terms, a general description of Bayesian estimation using Monte Carlo integration will be provided. Consider the problem of evaluating the weighted mean of a function $h(x)$ of a random variable X, given a weighting function $f(x)$, viz.

$$E_f[h(X)] = \int_\chi h(x) f(x) dx, \qquad (4)$$

where $\chi$ is the domain of X and $f(\cdot)$ is a proper density function, i.e., $f(x) \geq 0$ for $x \in \chi$ and $$\int_\chi f(x) dx = 1.$$

An estimate of (4) can be obtained by evaluating the empirical average $$\bar{h} = \frac{1}{N_s} \sum_{n=1}^{N_s} h(x_n), \qquad (5)$$

where the $x_n$'s are samples from the distribution $f(x)$. Moreover, the speed of convergence of the method can be evaluated by estimating the variance of $\bar{h}$ which can be obtained by $$\sigma_{\bar{h}}^2 = \frac{1}{N_s(N_s-1)} \sum_{n=1}^{N_s} |h(x_n) - \bar{h}|^2. \qquad (6)$$

Here, x may be a scalar or a vector variable. When x is a vector, the integral in (4) is a multiple integral whose direct computation may become prohibitive as the dimension of x increases. From (7), the accuracy of the estimate (5) reduces with the square of the number of sample points. Moreover, numerical studies show that the dimension of x and the size $N_s$ are very weakly related in the sense that even though the dimension of x may increase, the order of magnitude of $N_s$ remains unchanged. Hence, by using a MCMC simulation to select hypothetical data patterns in the channel data probability summation, the exponential growth of computational complexity that is commonly encountered in performing multiple integrals may be avoided.

The Monte Carlo integration includes important sampling. In the method of important sampling $E_f[h(X)]$ is evaluated by performing the empirical average $$E_f[h(X)] \approx \frac{1}{N_s} \sum_{n=1}^{N_s} \frac{f(x_n)}{f_a(x_n)} h(x_n), \qquad (7)$$

where the samples $x_n$ are chosen from the auxiliary distribution $f_a(x)$. Equation (7) follows from the alternative representation of (4)

$$E_f[h(X)] = \int_\chi h(x) \frac{f(x)}{f_a(x)} f_a(x) dx \qquad (8)$$

and performing the integral using Monte Carlo integration based on the distribution $f_a(x)$. Similar to $f(x)$, $f_a(x)$ is preferably a proper density function, i.e., it satisfies the conditions $f_a(x) \geq 0$ for $x \in X$ and $$\int_x f_a(x) dx = 1.$$

When $f_a(x) = f(x)$, (7) reduces to regular Monte Carlo integration.

It turns out that, for a fixed value of $N_s$, many choices of $f_a(x)$ that are different from $f(x)$ may result in more accurate evaluation of $E_f[h(x)]$. In particular, one auxiliary distribution $f_a(x)$ that allows accurate evaluation of $E_f[h(x)]$ with minimum number of samples is $$f_{a,o}(x) = |h(x)| f(x) \Big/ \int_x |h(x)| f(x) dx.$$

When available, this auxiliary distribution allows exact evaluation of $E_f[h(x)]$ by using a single sample. However, $f_{a,o}(x)$ depends on the integral $$\int_x |h(x)| f(x) dx$$

which may not be available. In fact, when $h(x) > 0$ for $x \in X$, the latter is the integral seeking to be solved.

A practical approximation that has been motivated from importance sampling which usually results in a better approximation than (7) is $$\bar{h} = \frac{\sum_{n=1}^{N_s} \frac{f(x_n)}{f_a(x_n)} h(x_n)}{\sum_{n=1}^{N_s} \frac{f(x_n)}{f_a(x_n)}}, \tag{9}$$

where here also, $x_n$ is chosen from the distribution $f_a(x)$. A special case of (9), of particular interest, is obtained when $f_a(x)$ is uniform over a selected range of x. In order to minimize $N_s$, this selected range is chosen such that it covers the values of x for which $f(x)h(x)$ is significant. In other words, x is limited to the important samples that contribute to the desired integral. When $f_a(x)$ is uniform, (9) simplifies to $$\bar{h} = \frac{\sum_{n=1}^{N_s} f(x_n) h(x_n)}{\sum_{n=1}^{N_s} f(x_n)}. \tag{10}$$

Other auxiliary distributions can be used as well, as discussed further herein. For a general description of Monte Carlo methods, see G. Fishman, *Monte Carlo: concepts, algorithms and applications*, New York: Springer-Verlag, 1996 and C. P. Robert and G. Casella, *Monte Carlo Statistical Methods*: Springer-Verlag, New York, 1999, each of which is incorporated by reference herein.

As discussed further below, it may be desirable to incorporate additional information into the conditional bit probability. For example, extrinsic information from a forward error correction decoder may be used to improve the LLR. If such extrinsic information is given by $\lambda_2^e$, the channel data bit probability summation can be expressed as $$\begin{aligned} P(d_k(i) &= +1 | y(i), \lambda_2^e(i)) \\ &= \sum_{d_{-k}(i)} P(d_k(i) \\ &= +1, d_{-k}(i) | y(i)), \lambda_2^e(i) \\ &= \sum_{d_{-k}(i)} P(d_k(i) \\ &= +1 | y(i), d_{-k}(i), \lambda_2^e(i)) P(d_{-k}(i) | y(i), \lambda_2^e(i)), \end{aligned} \tag{11}$$

This formulation will be used in the following derivations, although it should be understood that the presently disclosed inventive techniques can also be applied in the absence of extrinsic information from a forward error correction decoder.

For simplicity in notation, the time index 'i' is dropped from all the involved variables for brevity in the following discussion. Hence, $P(d_k|y)$ is a short-hand notation for $P(d_k(i)|y(i))$.

To obtain a summation similar to (5) for computation of $P(d_k = +1 | y, \lambda_2^e)$, $P(d_{-k} | y, \lambda_2^e)$ is used as the density function, $f(x)$, and $P(d_k = +1 | y, d_{-k}, \lambda_2^e)$ is used as the function whose weighted sum is to be obtained, $h(x)$. An estimate of $P(d_k = +1 | y, \lambda_2^e)$ is thus obtained by evaluating the empirical average $$P(d_k = +1 | y, \lambda_2^e) \approx \frac{1}{N_s} \sum_{n=1}^{N_s} P(d_k = +1 | y, d_{-k}^{(n)}, \lambda_2^e), \tag{12}$$

where $d_{-k}^{(n)}$ are the samples that are chosen from the distribution $P(d_{-k}|y,\lambda_2^e)$, and, when appearing in equations like (12), $d_{-k}^{(n)}$ is the shorthand notation for $d_{-k} = d_{-k}^{(n)}$.

Starting with (10), treat $P(d_{-k}|y,\lambda_2^e)$ as $f(x)$, and $P(d_k = +1 | y, d_{-k}, \lambda_2^e)$ as $h(x)$. This gives $$P(d_k = +1 | y, \lambda_2^e) \approx \frac{\sum_{n=1}^{N_s} P(d_k = +1 | y, d_{-k}^{(n)}, \lambda_2^e) P(d_{-k}^{(n)} | y, \lambda_2^e)}{\sum_{n=1}^{N_s} P(d_{-k}^{(n)} | y, \lambda_2^e)}, \tag{13}$$

where the samples $d_{-k}^{(n)}$ are chosen from a uniform distribution.

Equations (12) and (13) thus present alternate approaches to estimating the channel data bit probabilities; equation (12) using an auxiliary distribution set equal to a conditional channel data bit probability, and equation (13) using a uniform distribution. Various auxiliary distributions may be chosen.

In accordance with one embodiment of the present invention, using the computation based on (12), $P(d_k = +1 | y, d_{-k}^{(n)},$ $\lambda_2^e$), is evaluated for n=1, 2, ..., $N_s$. For this, the LLR is defined as $$\lambda_1^{(n)}(d_k) = \ln\frac{P(d_k = +1|y, d_{-k}^{(n)}, \lambda_2^e)}{P(d_k = -1|y, d_{-k}^{(n)}, \lambda_2^e)} \quad (14)$$

and can be expanded as $$\begin{aligned}\lambda_1^{(n)}(d_k) &= \ln\frac{p(y|d_{-k}^{(n)}, d_k = +1)P(d_{-k}^{(n)}, d_k = +1|\lambda_2^e)}{p(y|d_{-k}^{(n)}, d_k = -1)P(d_{-k}^{(n)}, d_k = -1|\lambda_2^e)} \\ &= \ln\frac{p(y|d_{-k}^{(n)}, d_k = +1)}{p(y|d_{-k}^{(n)}, d_k = -1)} + \lambda_2^e(d_k) \\ &= \frac{1}{2\sigma_n^2}(|y - A_{-k}d_{-k} + a_k|^2 - |y - A_{-k}d_{-k} - a_k|^2) + \lambda_2^e(d_k) \\ &= \frac{2}{\sigma_n^2}\Re\{a_k^H(y - A_{-k}d_{-k})\} + \lambda_2^e(d_k) \\ &= \frac{2}{\sigma_n^2}\Re\left\{y_k^{MF} - \sum_{\substack{l=0 \\ l \neq k}}^{K}\rho_{kl}d_l\right\} + \lambda_2^e(d_k)\end{aligned} \quad (15)$$

where $\Re\{\cdot\}$ denotes the real part, $A_{-k}$ is A with its k th column, $a_k$, removed, $y_k^{MF}=a_k^H y$ is the matched filter output for the $k^{th}$ channel and $\rho_{kl}=a_k^H a_l$ is the crosscorrelation between channels k and l. The simplification of the second line follows when the extrinsic information provided by each element of $\lambda_2^e$ is independent of those provided by its other elements, for example when there is interleaving as discussed below. If the elements of d are independent of one another this implies that $$\begin{aligned}\ln\frac{P(d_{-k}^{(n)}, d_k = +1|\lambda_2^e)}{P(d_{-k}^{(n)}, d_k = -1|\lambda_2^e)} &= \ln\frac{P(d_{-k}^{(n)}|\lambda_{2,-k}^e)}{P(d_{-k}^{(n)}|\lambda_{2,-k}^e)} + \ln\frac{P(d_k = +1|\lambda_2^e(d_k))}{P(d_k = -1|\lambda_2^e(d_k))} \\ &= \ln\frac{P(d_k = +1|\lambda_2^e(d_k))}{P(d_k = -1|\lambda_2^e(d_k))} \\ &= \lambda_2^e(d_k),\end{aligned} \quad (16)$$

where $\lambda_{2,-k}^e$ is $\lambda_2^e$ with $\lambda_2^e(d_k)$ dropped from it and the last identity follows from the definition of L-value. The third line in (15) follows since $$p(y|d) = \frac{1}{(2\pi\sigma_n^2)^{N/2}}e^{-|y-Ad|^2/2\sigma_n^2},$$

where $|\cdot|$ denotes the length of a vector. Once $\lambda_1^{(n)}(d_k)$ is obtained, recalling that $P(d_k=-1|y,d_{-k}^{(n)},\lambda_2^e)=1-P(d_k=+1|y,d_{-k}^{(n)},\lambda_2^e)$ and solving (16) for $P(d_k=+1|y,d_{-k}^{(n)},\lambda_2^e)$, we get $$P(d_k = +1|y, d_{-k}^{(n)}, \lambda_2^e) = \frac{1}{1 + \exp(-\lambda_1^{(n)}(d_k))}. \quad (17)$$

This is used in (12) for computation $P(d_k=+1|y,\lambda_2^e)$. Next, form the LLR by calculating $$\lambda_1(d_k) = \ln\frac{P(d_k = +1|y, \lambda_2^e)}{1 - P(d_k = +1|y, \lambda_2^e)}.$$

If desired, extrinsic LLR information $\lambda_1^e(d_k)$ may be derived from $$\lambda_1^e(d_k) = \lambda_1(d_k) - \lambda_2^e(d_k). \quad (18)$$

For example, extrinsic LLR information may be exchanged with a forward error correction decoder as discussed further below.

In accordance with another embodiment of the present invention, using computation based on (13), the LLR can be estimated from $$\lambda_1(d_k) = \ln\frac{P(d_k = +1|y, \lambda_2^e)}{P(d_k = -1|y, \lambda_2^e)} \quad (19)$$

Substituting (13) and its dual when $d_k=-1$ in (19), yields $$\lambda_1(d_k) = \ln\frac{\sum_{n=1}^{N_s} P(d_k = +1|y, d_{-k}^{(n)}, \lambda_2^e)P(d_{-k}^{(n)}|y, \lambda_2^e)}{\sum_{n=1}^{N_s} P(d_k = -1|y, d_{-k}^{(n)}, \lambda_2^e)P(d_{-k}^{(n)}|y, \lambda_2^e)}. \quad (20)$$

Using the Bayes rule, $$\begin{aligned}P(d_{-k}^{(n)}|y, \lambda_2^e) &= \frac{p(d_{-k}^{(n)}, y|\lambda_2^e)}{p(y|\lambda_2^e)} \\ &= \frac{p(y|d_{-k}^{(n)}, \lambda_2^e)P^e(d_{-k}^{(n)})}{p(y|\lambda_2^e)}\end{aligned} \quad (21)$$

where $P^e(d_{-k}^{(n)})$ is short-hand notation for $P(d_{-k}^{(n)}|\lambda_2^e)$, i.e., the probability of $d_{-k}=d_{-k}^{(n)}$ given the available extrinsic information. Similarly, $$P(d_k = +1|y, d_{-k}^{(n)}, \lambda_2^e) = \frac{p(y|d_{-k}^{(n)}, d_k = +1)P^e(d_k = +1)}{p(y|d_{-k}^{(n)}, \lambda_2^e)}. \quad (22)$$

Substituting (22), the dual of (22) with $d_k=+1$ replaced by $d_k=-1$, and (21) in (20), we obtain $$\lambda_1(d_k) = \ln\frac{\sum_{n=1}^{N_s} p(y|d_{-k}^{(n)}, d_k = +1)P^e(d_{-k}^{(n)})}{\sum_{n=1}^{N_s} p(y|d_{-k}^{(n)}, d_k = -1)P^e(d_{-k}^{(n)})} \cdot \frac{P^e(d_k = +1)}{P^e(d_k = -1)} \quad (23)$$

-continued $$= \ln \frac{\sum_{n=1}^{N_S} p(y \mid d_{-k}^{(n)}, d_k = +1) P^e(d_{-k}^{(n)})}{\sum_{n=1}^{N_S} p(y \mid d_{-k}^{(n)}, d_k = -1) P^e(d_{-k}^{(n)})} + \lambda_2^c(d_k).$$

Recalling that $\lambda_1^e(d_k) = \lambda_1(d_k) - \lambda_2^e(d_k)$, from (24).

$$\lambda_1^c(d_k) = \ln \frac{\sum_{n=1}^{N_S} p(y \mid d_{-k}^{(n)}, d_k = +1) P^e(d_{-k}^{(n)})}{\sum_{n=1}^{N_S} p(y \mid d_{-k}^{(n)}, d_k = -1) P^e(d_{-k}^{(n)})}. \quad (24)$$

Considering the MCMC simulation in further detail, a Markov chain can be constructed based on the channel model (1) and the a posteriori probability $P(d|y,\lambda_2^e)$. It can be shown that this Markov chain is an irreducible, aperiodic and reversible chain. It thus follows that, upon convergence of the chain, its stationary distribution matches that of $P(d|y,\lambda_2^e)$. Hence, the method may include constructing a MCMC simulation whose states are determined by different selections of the data vector $d=[d_1\ d_2\ \ldots\ d_K]^T$. For example, in a system with three channels and binary data, the state assignments may be chosen as shown in TABLE 1. Each state transition occurs as a result of flipping one of the bits in d. The selection of a bit is random and has equal probability for all the bits in d. The probability of transition is based on the a posteriori probability $P(d_k=+1|y,d_{-k},\lambda_2^e)$. In other words, the transition probability can be set to correspond to conditional channel data bit probabilities, for example, based on a model of the communication channel. Considering the three channel example of TABLE 1, if the current state is $s_0$ and $d_2$ is chosen for examination, the next state will be either $s_0$ or $s_2$. The decision to remain in $s_0$ or move to $s_2$ can be made according to the following rules:

(i) Calculate the a posteriori probability $p^+=P(d_2=+1|y, d_1=-1, d_3=-1, \lambda_2^e(d_2))$ (ii) Move to state $s_2$ with the probability $p^+$, otherwise remain in state $s_0$.

Figure 3:
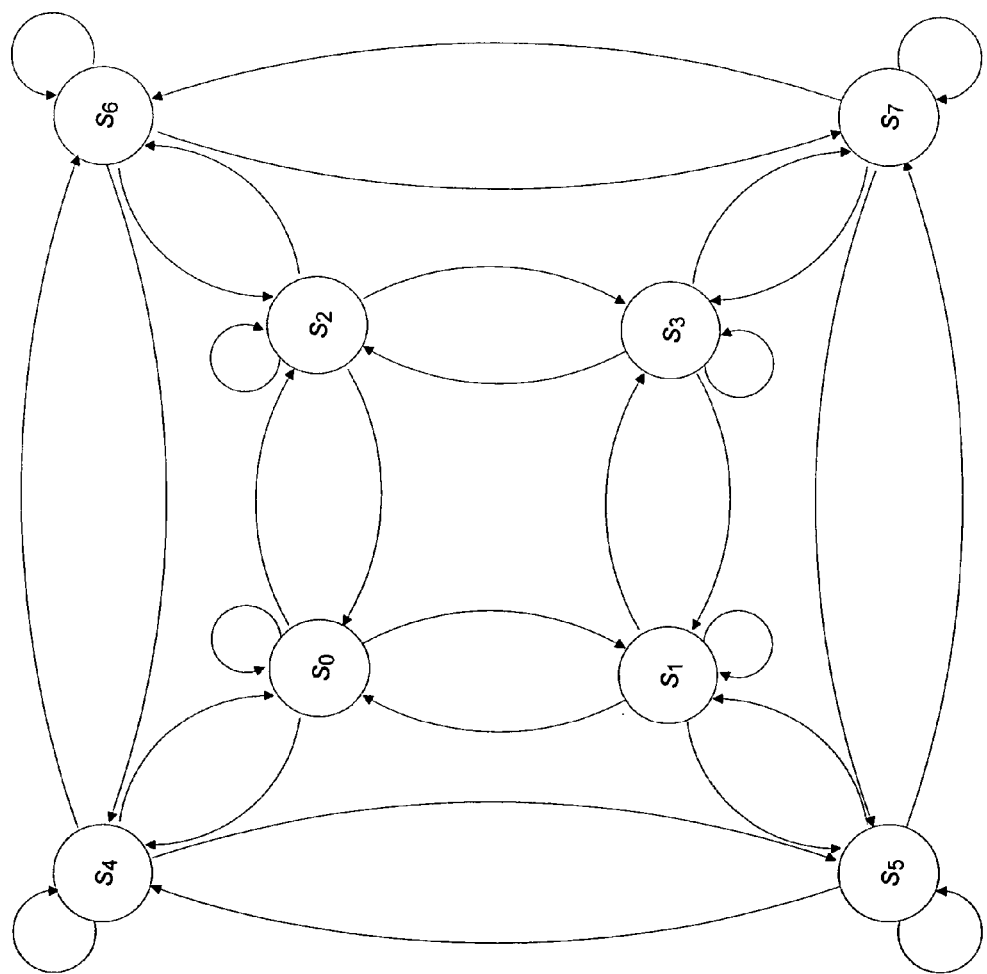
FIG. 3 is transition diagram of a Markov chain for a three-channel system in accordance with an embodiment of the present invention.

FIG. 3 presents a transition graph of this Markov chain. Possible transition between the states are indicated by arrows. These arrows are called edges. Presence of an edge indicates possible transition with a non-zero probability. If the probability of transition from one state to another is zero, no edge will connect the two states.

TABLE 1

Exemplary State Assignments for a
System of Three Binary Data Channels

| State | $d_3$ | $d_2$ | $d_1$ |
|---|---|---|---|
| $s_0$ | −1 | −1 | −1 |
| $s_1$ | −1 | −1 | +1 |
| $s_2$ | −1 | +1 | −1 |
| $s_3$ | −1 | +1 | +1 |
| $s_4$ | +1 | −1 | −1 |
| $s_5$ | +1 | −1 | +1 |
| $s_6$ | +1 | +1 | −1 |
| $s_7$ | +1 | +1 | +1 |

Note that, as channel noise decreases, the probability of some transitions may diminish toward zero and others may approach one. This means, in the absence of the channel noise, some of the edges will be essentially absent, and thus most of the useful properties of the underlying Markov chain may disappear. A practical consequence of this is that the MCMC simulation may exhibit a modal behavior: tendency to stay in certain states for long periods of time, failing to provide a good sampling. Modal behavior may be observed in a MCMC simulator at high signal to noise ratio, for example above 8 dB, in a MIMO system with four transmit antennas and quadrature signaling. In this situation, the Markov chain may have a tendency to spend long periods of time in the same state, causing insufficient variation in the hypothetical channel data samples, in turn causing poor estimates of the channel data probabilities and log likelihood ratios.

More particularly, as SNR increases, the samples generated by each MCMC simulation become highly correlated and often remain within a small subspace of the complete state space of all possible choices of d. This is because at high SNR, the Markov chain associated with an MCMC detector converges towards a reducible chain, i.e., it converts to a number of separate chains with very loose connections among them. Accordingly, MCMC detector loses the ability to move among all the states within the Markov chain and hence becomes incapable of generating accurate soft outputs. In other words, the MCMC detector may become trapped in parts of the associated Markov chain that may contain insignificant information about the transmitted symbols/bits.

One approach to helping to avoid this modal behavior at high SNR is to run the MCMC simulation as though the signal to noise ratio of the received signal is lower than the actual signal to noise ratio in order to ensure good statistical properties from the MCMC simulation. For example, the auxiliary distribution may be chosen to be a conditional channel data probability estimated at a low signal to noise ratio. Use of an auxiliary distribution corresponding to a low signal to noise ratio, for example below 8 dB, or more particularly below 5 dB, avoids modal behavior of the MCMC simulator helps to prevent this problem by providing more perturbation in the MCMC simulator. Estimation of the channel data probability for higher signal to noise ratio is accomplished by scaling the calculated bit probability distribution to account for the auxiliary distribution. In other words, the correct value of the noise variance is used in calculating the probabilities in (24). Computer simulations reveal that this approach performs well, especially in highly loaded cases when K>2N. Alternate approaches to helping to avoid modal behavior are discussed further below.

A few observations from FIG. 3 are in order; these generalizations also apply to a system with an arbitrary number of channels:

For an observed vector y and given extrinsic information vector $\lambda_2^e$, the a posteriori probabilities $P(d_k=+1|y,d_{-k},\lambda_2^e)$ and $P(d_k=-1|y,d_{-k},\lambda_2^e)$ and, hence, the elements of the transition matrix for the Markov chain are fixed. This implies that the Markov chain is homogeneous.

Any arbitrary pairs of states $s_i$ and $s_j$ are connected through a sequence of edges. This means transition between any arbitrary pairs of states $s_i$ and $s_j$ is possible. This in turn implies that the multi-channel Markov chain is irreducible.

There is an edge connecting each state to itself. In other words, for any $s_i$, the probability of staying in the state is non zero, i.e. $\pi_{ii}>0$. This implies that the multi-channel Markov chain is aperiodic.

Since the multi-channel Markov chain is homogeneous, irreducible and aperiodic, it can be proven that it converges to a unique stationary distribution.

Note that the a posteriori probability $P(d|y,\lambda_2^e)$ is the stationary distribution of the multi-channel Markov chain: the probability that the multi-channel Markov chain is in the state associated with d. It can be shown that $P(d|y,\lambda_2^e)$ satisfies the reversibility rule, and thus, if the multi-channel Markov chain is run for sufficient number of iterations, it converges toward the desired distribution $P(d|y,\lambda_2^e)$.

In accordance with an embodiment of the invention, each step of the MCMC simulation may begin with a random selection of one of the state variable, $d_k$ as the initial state of the MCMC simulation. The next state is then determined according to the procedure described above. In accordance with an alternate embodiment of the invention, the state variables may be scheduled such that they each get turn on a regular basis. For example, one possible version of Gibbs sampler for the multi-channel detector is summarized as follows:

Initialize $d^{(-N_b)}$ (randomly),
for $n=-N_b+1$ to $N_s$
    draw sample $d_1^{(n)}$ from $P(d_1|d_2^{(n-1)},\ldots,d_K^{(n-1)},y,\lambda_2^e)$
    draw sample $d_2^{(n)}$ from $P(d_2|d_1^{(n)},d_3^{(n-1)},\ldots,d_K^{(n-1)},y,\lambda_2^e)$
    draw sample $d_K^{(n)}$ from $P(d_K|d_1^{(n)},\ldots,d_{K-1}^{(n)},y,\lambda_2^e)$ In this routine $d^{(-N_b)}$ is initialized randomly, optionally taking into account the a priori information $\lambda_2^e$. The 'for' loop examines the state variables, $d_k$'s, in order, $N_b+N_s$ times. The first $N_b$ iterations of the loop, called burn-in period, allows the Markov chain to converge to near its stationary distribution. The samples used for LLR computations are those of the last $N_s$ iterations.

The samples of d generated by a single Markov chain, however, are usually highly correlated. Hence, the samples generated by one Gibbs sampler may not contain samples with sufficient statistics, unless the Gibbs sampler is run for a very large number of iterations. This can happen, for example, at high signal to noise ratio as discussed above.

Alternately, in accordance with another embodiment of the present invention, a number of simulations can be run in parallel. This introduces parallelism in the detector implementation, which in turn allows drawing more samples. Such an approach may also prove useful when available processing speed is a practical limitation. Moreover, the samples drawn in successive iterations from a single Markov chain are correlated. In contrast, the parallel simulations draw a pool of samples which are less correlated; generally only the samples that belong to the same Markov chain are correlated.

Hence, a plurality of MCMC simulations can be run to stochastically select hypothetical data patterns to use in the probability summation. For example, a plurality of Gibbs samplers can be initialized and run. Although the parallel Gibbs samplers may be inefficient if a large burn-in period, $N_b$, is used, the parallel Gibbs samplers can also be run with no burn-in period at all, in accordance with yet another embodiment of the present invention. It is noted that since addition of any sample to the set of samples of d is an additional contribution to the summation turns, omitting the burn-in period can help to improve performance.

Various ways of initializing the MCMC simulations can be performed. For example, as discussed above, the MCMC simulations can be initialized using a random channel data pattern as the starting state. For example, each of the parallel MCMC simulations can be initialized to a different random channel data pattern to help ensure it explores a different portion of the state space of d. Other techniques, however, can perform better as has been discovered and will now be explained.

The MCMC simulation can be initialized using a channel data pattern which is known to provide a good match to the received signal. That is to say, an initial data pattern d̃ can be chosen such that y−Ad̃ is small. Hypothetical data patterns where the difference y−Ad̃ is small tend to be dominant terms in the probability summation. Initial values of d̃ can be obtained using known multi-channel receiver techniques, including for example zero-forcing equalizers, minimum mean square error equalizers, and successive interference cancellation.

It has been discovered, however, that initializing the MCMC summation using a single technique can sometimes fail to provide good results. This is because there can be multiple different values of d where the difference y−Ad is small, separated by regions of low probability. Hence a single MCMC simulation may tend to be trapped near the peak and fail to sum over a significant portion of the dominant terms. Improved performance can be obtained by initializing a number of parallel MCMC simulations using different starting values of d.

For example, in accordance with one embodiment of the present invention, multiple MCMC simulations can be initialized, where the starting state of at least a first one of the MCMC simulations is selected using a first approach, and the starting state of at least a second one of the MCMC simulations is selected using a second approach different from the first approach. For example, one MCMC simulation can be initialized with a channel data pattern estimated from the multi-channel signal and the other MCMC simulations initialized with a random data pattern. As another example, multiple MCMC simulations can be initialized with channel data patterns estimated from the multi-channel signal using different approaches. Different approaches for estimating data from the multi-channel signal include, for example, algorithms such as zero forcing equalization, minimum mean square error equalization, and successive interference cancellation.

The improved performance can be understood as will now be explained. Using multiple randomly initialized MCMC simulations provides good performance because the simulations are highly likely to span values of d which provide dominant probability terms. However, random initialization can be inefficient, since there may be many iterations of the MCMC simulation for which the resulting probability terms are insignificant before areas of high probability are reached. Inclusion of at least one MCMC simulation where the starting state is initialized using estimated data helps ensure that at least one area of high probability is included. Although it might be expected that using a single MCMC simulation initialized with estimated data might perform well, this is not always the case. This is because the single MCMC simulation may be trapped in an isolated set of states with high probability and may fail to explore other data patterns which also result in high probability. For example, the zero forcing, minimum mean square error, and successive interference cancellation may converge to an incorrect result having a large number of errors relative to transmitted data pattern. In such a case, an MCMC simulation initialized with that incorrect result will tend to remain stuck in a region of incorrect data patterns. By including MCMC simulations which are initialized using different approaches, the probability that the correct data patterns are used in the simulation increases substantially. Since different receiver approaches tend to fail under different circumstances, the performance of the MCMC can therefore be enhanced by including MCMC simulations initialized using different approaches to obtain the starting state. So, for example, one MCMC simulation may be initialized with a data pattern obtained from one receive algorithms, such as zero forcing (ZF), minimum mean square error (MMSE) estimation, or successive interference cancellation (SIC), and other MCMC simulations initialized using a random data pattern. As another example, MCMC simulations may be initialized using two or more known receive algorithms. As yet another example, MCMC simulations may be initialized using a combination of receive algorithms and randomly selected data patterns.

Figure 11:
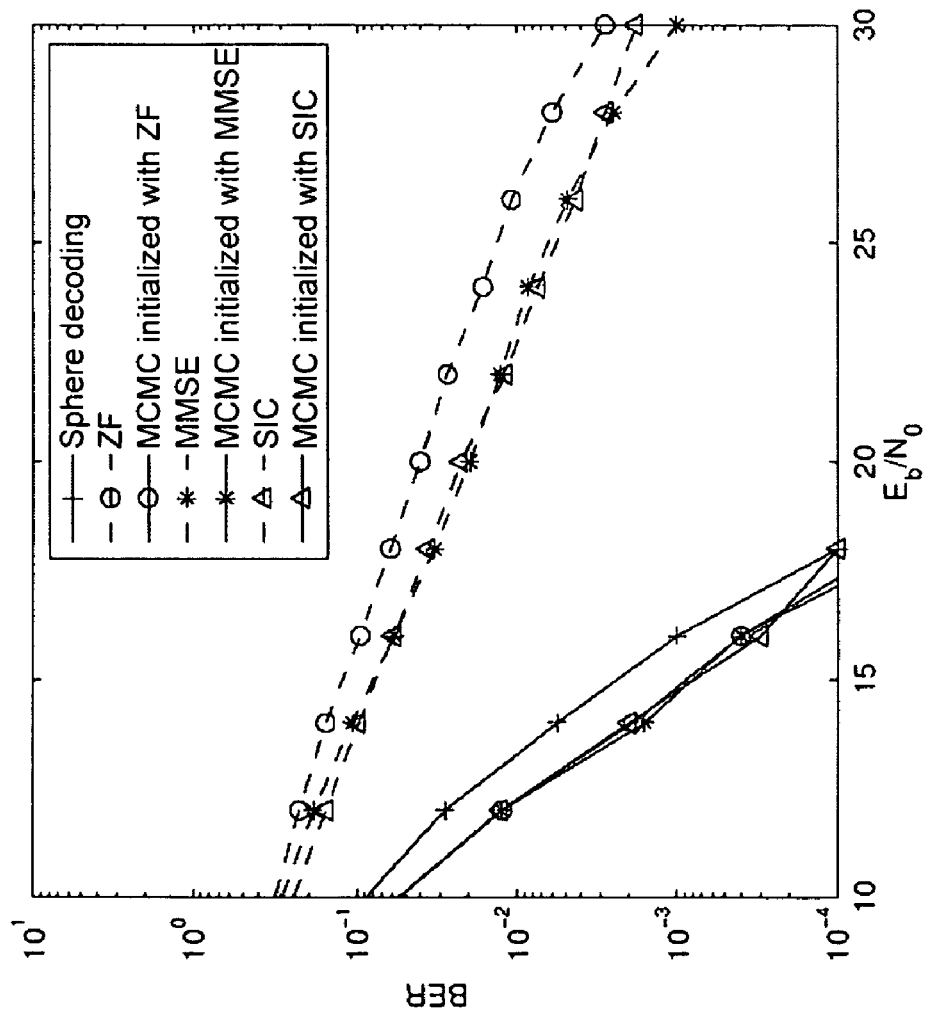
FIG. 11 is a graph of bit error rate performance for various 4×4 MIMO systems including MCMC simulation in accordance with embodiments of the present invention.
Figure 12:
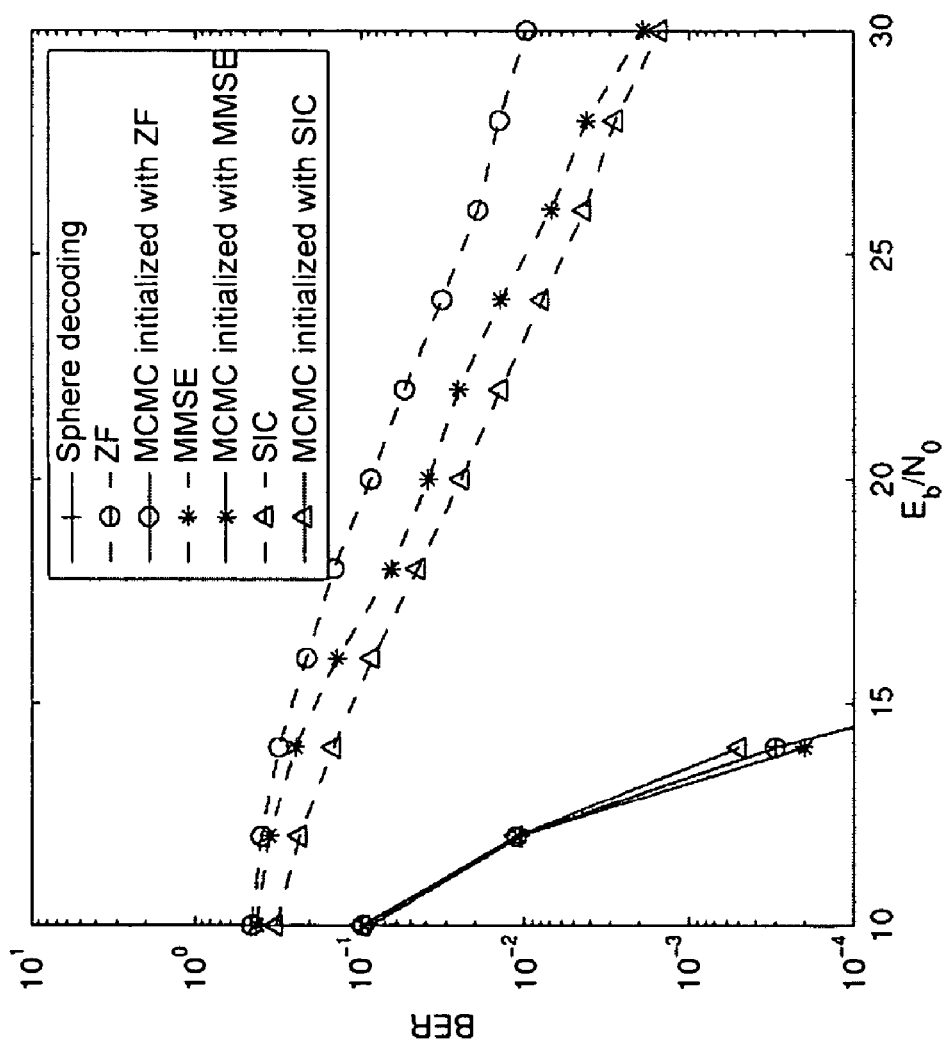
FIG. 12 is a graph of bit error rate performance for various 8×8 MIMO systems including MCMC simulation in accordance with embodiments of the present invention.

Simulation results are presented for two exemplary MIMO systems. The first system includes 4 transmit and 4 receive antennas, for which results are shown in FIG. 11. The second system includes 8 transmit and 8 receive antennas, for which results are shown in FIG. 12. The MCMC system bit error rate (BER) performance is obtained using 20 parallel simulations, where one simulation is initialized using a data estimating algorithm and the remaining simulations are initialized using randomly selected data patterns. For comparison, BER results are also shown for sphere decoding (SD) and for detection using conventional ZF, conventional MMSE, and conventional SIC to obtain the data estimate. Sphere decoding is a known, suboptimal estimation technique that, while complex, provides excellent performance results.

For both systems, data symbols are chosen from a 16-point QAM constellation. The channel code is a rate ½ parallel convolutional code with polynomials $1+D^2+D^7$ and $1+D+D^3+D^5+D^7$. Each block of information bits has a length of 2560. The channel matrix A is block fading, meaning that for each block of data it is fixed and changes to an independent channel for the next block. The elements of A are independent, identically distributed, complex Gaussian.

It can be seen that the performance of MCMC techniques provides significant performance improvement over conventional ZF, MMSE and SIC algorithms, providing improvements of about 20 dB for BER of $10^{-4}$. Performance is comparable to SD.

Figure 2:
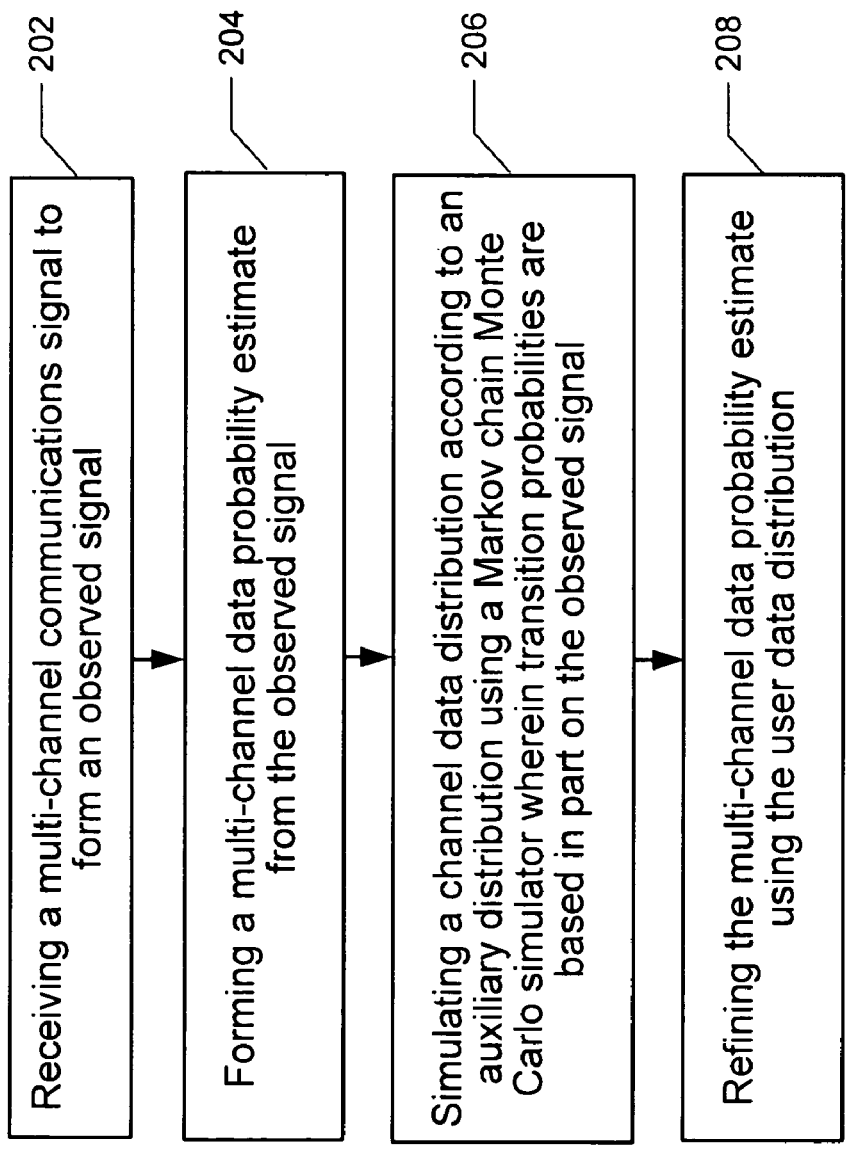
FIG. 2 is a flow chart of an alternate method for estimating channel data probabilities in a multi-channel communication system receiver in accordance with an embodiment of the present invention.

An alternate method for estimating channel data probabilities in a multi-channel communications system receiver is illustrated in FIG. 2 in accordance with an embodiment of the present invention. The method, indicated generally at 200, may include receiving 202 a multi-channel communications signal to form an observed signal. Various techniques for receiving a multi-channel communications signal are known as discussed within, and including, for example, a downconverting receiver. Another step in the method may include forming 204 a multi-channel data probability estimate from the observed signal. For example, forming a channel data probability estimate may be performed by soft decision estimation in a multi-channel detector. The method may also include simulating 206 a channel data distribution according to an auxiliary distribution using a Markov chain Monte Carlo simulator. For example, simulating a channel data distribution may be performed as discussed above. As discussed above, the auxiliary distribution may correspond to a channel data distribution determined for a low signal to noise ratio, or the auxiliary distribution may be correspond to a uniform distribution.

A final step in the method may include refining 208 the multi-channel data probability estimate using the channel data distribution. For example, refining the multi-channel data probability estimate may be performed as discussed above. Refining the multi-channel data probability estimate may include exchanging extrinsic information with a forward error correction decoder as discussed further below.

Figure 4:
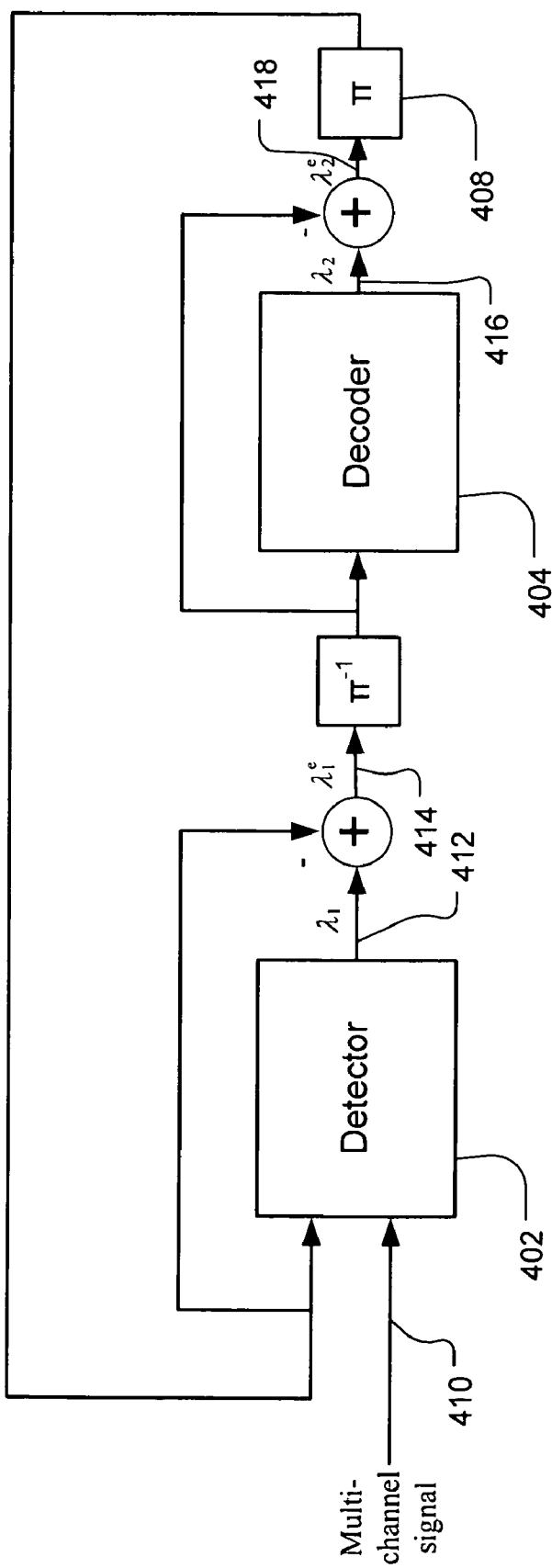
FIG. 4 is a block diagram of a multi-channel receiver in accordance with an embodiment of the present invention.

As discussed above, reception of a multi-channel signal may involve exchanging information between a detector and a decoder. For example, FIG. 4 illustrates a multi-channel receiver, shown generally at 400, in accordance with an embodiment of the present invention, which includes a detector 402 and a decoder 404 in a turbo decoding loop. The detector provides a set of soft output sequences $\lambda_1$ (LLRs) 412 for the information sequences $d_1(i), d_2(i), \ldots, d_K(i)$, based on the observed input vector sequence y(i) 410 and the extrinsic information (a priori soft information) 418 from the previous iteration of the decoder. After subtracting the extrinsic information from the LLR output 412 of detector, the extrinsic information $\lambda_1^e$ 414 (remaining information new to the decoder) is passed to the decoder for further processing. Similarly, the extrinsic information (soft input) to each FEC decoder is subtracted from the decoder output $\lambda_2$ 416 to generate the extrinsic information $\lambda_2^e$ 418 before being fed back to the detector. Typically, the turbo decoding loop includes an interleaver 408 and deinterleaver 406 between the detector and decoder. Multiple iterations of exchanging extrinsic information between the detector and decoder may be used to refine estimates of the channel data. It has also been experimentally found that performance may be enhanced by running the MCMC simulation at a signal to noise ratio below the estimated signal to noise ratio of the received signal and gradually increasing the signal to noise ratio used by the MCMC simulation as the detector and decoder iterate.

For $d_k(i)$, $\lambda_1(d_k(i))$ is used to denote the soft output of SISO multi-channel detector, $\lambda_2(d_k(i))$ to denote the soft output of the FEC decoder, and $\lambda_1^e(d_k(i))$ and $\lambda_2^e(d_k(i))$ to denote the corresponding extrinsic information, respectively. Moreover, the vectors $\lambda_2^e(i)=[\lambda_2^e(d_1(i))\lambda_2^e(d_2(i)) \ldots \lambda_2^e(d_K(i))]^T$ and $\lambda_1^e(k)=[\lambda_1^e(d_k(1))\lambda_1^e(d_k(2)) \ldots \lambda_1^e(d_k(M))]^T$ are defined. Note that $\lambda_2^e(i)$ denotes the extrinsic information of all channels at time slot i, while $\lambda_1^e(k)$ denotes the extrinsic information of channel k across one data block.

When data symbols are binary, taking values of +1 and −1, each symbol information is quantified by the LLR of a transmitted "+1" and a transmitted "−1", given the input information, i.e., $$\lambda_1(d_k(i)) = \ln \frac{P(d_k(i) = +1 \mid y(i), \lambda_2^e(i))}{P(d_k(i) = -1 \mid y(i), \lambda_2^e(i))}, \quad (25)$$

and $$\lambda_2(d_k(i)) = \ln \frac{P(d_k(i) = +1 \mid \lambda_2^e(k), \text{decoding})}{P(d_k(i) = -1 \mid \lambda_2^e(k), \text{decoding})}. \quad (26)$$

The L-values in (26) can be obtained, for example, by following a turbo decoding algorithm. The decoder may include, for example, a set of parallel channel decoders, one decoder for each channel, when forward error correction encoded for each channel is performed independently. Alternately, the decoder may include a number of channel decoders operating across multiple channels each. Various suitable decoders for use in this receiver can be used, including, for example, block decoders, convolutional decoders, and turbo decoders. The data need not be limited to binary, as will be discussed further below.

Figure 5:
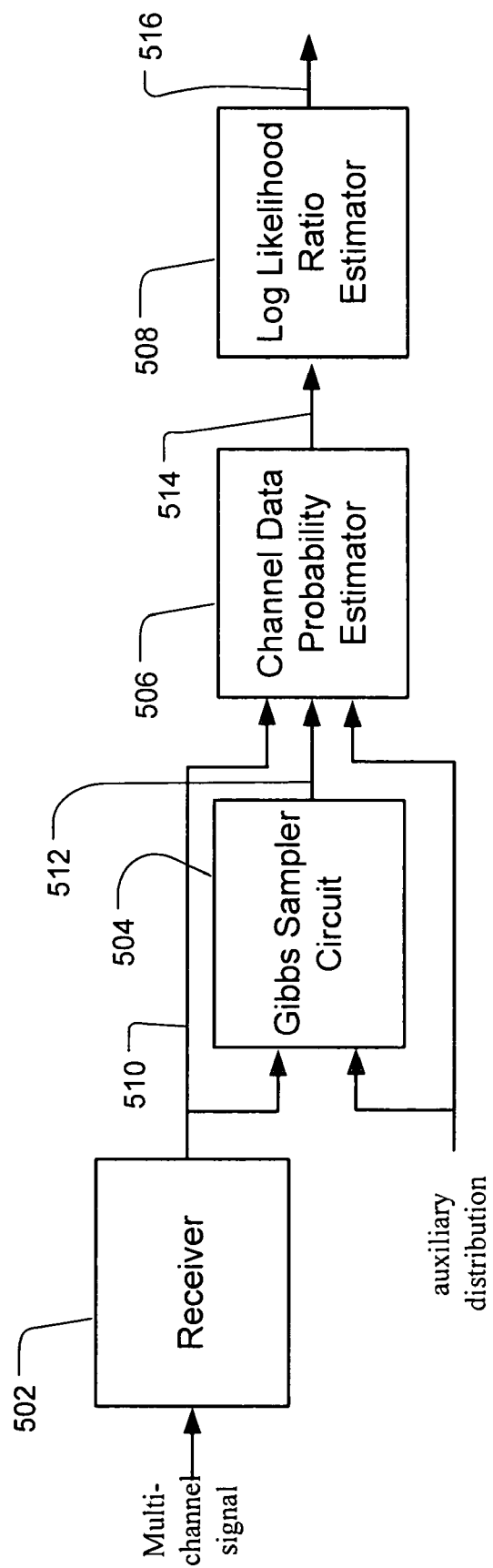
FIG. 5 is a block diagram of a detector for estimating channel data probabilities in a multi-channel communication system in accordance with an embodiment of the present invention.

Various implementations of a detector 402 will now be discussed in further detail. For example, FIG. 5 illustrates a detector in accordance with one embodiment of the present invention. The detector 402, may include a receiver 502, a Gibbs sampler circuit 504, and a channel data probability estimator 506. The receiver is configured to receive a multi-channel signal and output an observed signal 510. For example, the receiver may include a matched filter, such as a despreader or correlator for CDMA signals. The Gibbs sampler circuit is coupled to the receiver and accepts the observed signal. The Gibbs sampler circuit is configured to generate stochastically selected channel data hypothesis. For example, channel data hypotheses may be selected based in part on the observed signal and a channel model using a MCMC simulator as discussed above. The channel data probability estimator 506 is coupled to the receiver 502 and the Gibbs sampler circuit 504, and is configured to estimate channel data probabilities 514 from the observed signal 510 and the stochastically selected channel data hypotheses 512. For example, in accordance with another embodiment of the present invention the channel data probability estimator may form the estimates of channel data probabilities by performing a scaled summation of conditional channel data probabilities, where the conditional channel data probabilities are conditioned on the observed signal and channel data samples and the extrinsic information provided by the decoder is taken into account as discussed above. Scaling may be performed by taking into account the auxiliary distribution selected.

Figure 10:
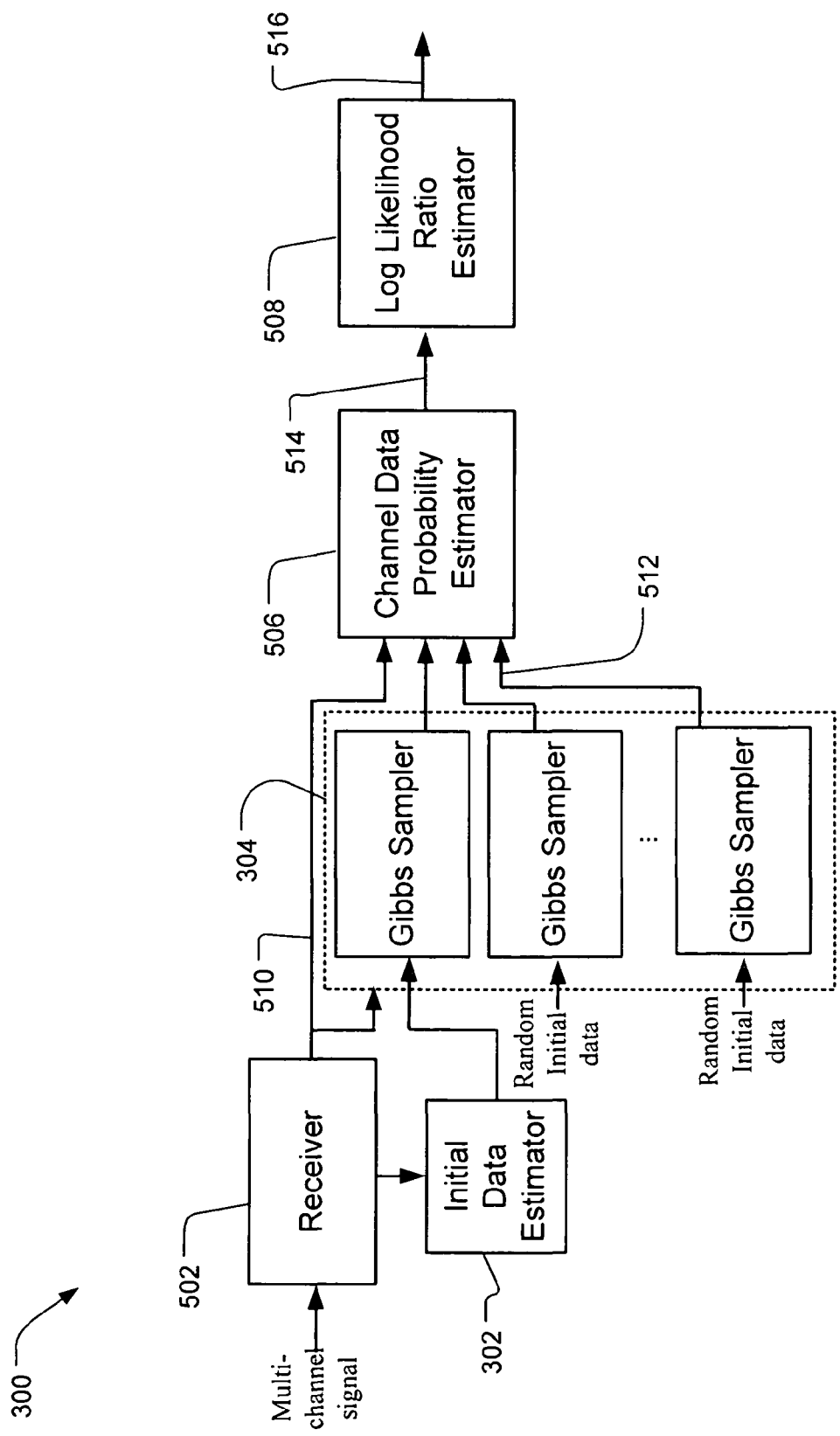
FIG. 10 is a block diagram of a detector for estimating channel data probabilities in a multi-channel communication system in accordance with another embodiment of the present invention.

Optionally, in accordance with another embodiment of the present invention, a detector 300 may include an initial data estimator 302 coupled to the receiver and configured to generate at least one initial channel data estimate from the observed signal, and a plurality of Gibbs samplers 304 as illustrated in FIG. 10. As discussed above, the detector may include more than one initial data estimator, each initial data estimator initializing one of the Gibbs samplers using a different approach from the other initial data estimators. For example, initial data may be estimated using receiver algorithms, such as ZF, MMSE, SIC, and the like.

In accordance with another embodiment of the present invention, the detector may also include a log likelihood estimator 508 coupled to the channel data probability estimator 506 and configured to estimate channel data log likelihood estimates 516 from the channel data probabilities 514.

As discussed above, the detector 402 provides several advantages over detectors disclosed in the prior art. In particular, the detector may provide more rapid convergence in the receiver than previously known iterative techniques. Additionally, it may be possible to provide a multi-channel MIMO system wherein the number of transmit antennas is greater than the number of receive antennas (a condition often referred to as "overloaded" due to the limited ability of prior art detectors to accommodate such a situation), or a multi-channel CDMA system wherein the number of users is greater than the spreading gain of the system.

Additional detail on certain detailed embodiments of the detector 402 will now be provided. In developing a circuit implementation of the detector, it is helpful to perform the processing in a log domain. By operating in the log domain, numerical stability is improved and lower precision may be used. This allows for smaller chip-size and very fast clock rates. The log-domain formulation also lends itself to a hardware architecture that involves primarily addition, subtraction, and compare operations. Moreover, pipelining can be introduced in the proposed architecture in straightforward manner. Although pipelining induces some delay in the Gibbs sampler loop, the impact of this delay on the behavior of the MCMC simulator has been found to be negligible.

Considering the general case where all the involved variables/constants in the channel model of (1) is written more explicitly as $$y_c = A_c d_c + n_c \qquad (27)$$

where the subscript 'c' is to emphasize the variables are complex-valued. Here, for convenience of formulations that follow, it is assumed that $A_c$ has N/2 rows and K/2 columns. This implies that, in the case of a MIMO system, there are K/2 transmit and N/2 receive antennas and, in the case of a CDMA system, there are K/2 channels with spreading codes of length N/2. Accordingly, $d_c$ has a length of K/2 and $y_c$ and $n_c$ are of length N/2.

The realization of the detection algorithms is simplified by rearranging (27) in terms of real and imaginary parts of the underlying variables and coefficients. Such rearrangement is straightforward and leads to the equation $$y = Ad + n \qquad (28)$$

where $$y = \begin{bmatrix} \mathcal{R}\{y_{c,1}\} \\ \mathcal{I}\{y_{c,1}\} \\ \vdots \\ \mathcal{R}\{y_{c,N/2}\} \\ \mathcal{I}\{y_{c,N/2}\} \end{bmatrix},$$

$$A = \begin{bmatrix} \mathcal{R}\{a_{c,1,1}\} & -\mathcal{I}\{a_{c,1,1}\} & \cdots & \mathcal{R}\{a_{c,1,K/2}\} & -\mathcal{I}\{a_{c,1,K/2}\} \\ \mathcal{I}\{a_{c,1,1}\} & \mathcal{R}\{a_{c,1,1}\} & \cdots & \mathcal{I}\{a_{c,1,K/2}\} & \mathcal{R}\{a_{c,1,K/2}\} \\ \vdots & & \ddots & & \vdots \\ \mathcal{R}\{a_{c,N/2,1}\} & -\mathcal{I}\{a_{c,N/2,1}\} & \cdots & \mathcal{R}\{a_{c,N/2,K/2}\} & -\mathcal{I}\{a_{c,N/2,K/2}\} \\ \mathcal{I}\{a_{c,N/2,1}\} & \mathcal{R}\{a_{c,N/2,1}\} & \cdots & \mathcal{I}\{a_{c,N/2K/2}\} & \mathcal{R}\{a_{c,N/2,K/2}\} \end{bmatrix},$$

$$d = \begin{bmatrix} \mathcal{R}\{d_{c,1}\} \\ \mathcal{I}\{d_{c,1}\} \\ \vdots \\ \mathcal{R}\{d_{c,K/2}\} \\ \mathcal{I}\{d_{c,K/2}\} \end{bmatrix},$$

$$n = \begin{bmatrix} \mathcal{R}\{n_{c,1}\} \\ \mathcal{I}\{n_{c,1}\} \\ \vdots \\ \mathcal{R}\{n_{c,N/2}\} \\ \mathcal{I}\{n_{c,N/2}\} \end{bmatrix},$$

$\mathcal{R}\{\cdot\}$ and $\mathcal{I}\{\cdot\}$ denote the real and imaginary parts of the arguments, $a_{c,i,j}$ is the $ij^{th}$ element of $A_c$, and $y_{c,i}$, $d_{c,i}$ and $n_{c,i}$ are the $i^{th}$ elements of y, d and n, respectively. Note that when the elements of $d_c$ are from an L×L quadrature amplitude modulated (QAM) constellation, the elements of d are from an L-ary pulse amplitude modulation (PAM) alphabet. Also note that with the sizes specified above, y and n will be vectors of length N, d is a vector of length K, and A will be an N-by-K matrix. Many alternative definitions of (2a) are also possible, including for example defining $$y = \begin{bmatrix} \mathcal{R}\{y\} \\ \mathcal{I}\{y\} \end{bmatrix}$$

and selecting A, d, and n accordingly.

The disclosed inventive techniques can also accommodate situations where the transmitted symbols are non-binary (e.g. QPSK modulation). This can be understood by the following derivation. First, define b as an information bit, and P(b=+1) and P(b=−1) as the probabilities of b being equal to +1 and −1, respectively. If $L=2^M$, each element of d represents a set of M coded bits. Accordingly, d may be obtained through a mapping of a set of KM information bits $b_1, b_2, \ldots, b_{KM}$. Note that the LLR values associated with these bits, can be obtained from the conditional probability $P(b_k=+1|y,\lambda_2^e)$, for k=1, 2, ..., KM as discussed above. Here, $\lambda_2^e$ is the set of a priori (extrinsic) information (the probabilities or LLR values) associated with information bits $b_1, b_2, \ldots, b_{KM}$ from the channel decoder. Define the vectors $b=[b_1\ b_2\ \ldots\ b_{KM}]^T$ and $b_{-k}=[b_1\ \ldots\ b_{k-1}\ b_{k+1}\ \ldots\ b_{KM}]^T$, and note that $$P(b_k = +1 \mid y, \lambda_2^e) = \sum_{b_{-k}} P(b_k = +1, b_{-k} \mid y, \lambda_2^e) \qquad (29)$$
$$= \sum_{b_{-k}} P(b_k = +1 \mid y, b_{-k}, \lambda_2^e) P(b_{-k} \mid y, \lambda_2^e),$$

where the second identity follows by applying the chain rule, and the summation is over all possible values of $b_{-k}$. As discussed above, the number of combinations that $b_{-k}$ takes is equal to $2^{KM-1}$, and hence the Gibbs sampler is used as discussed above to select important samples. In accordance with one embodiment of the present invention, the Gibbs sampler may examine the successive elements of b and assign them random values such that the choices of b that result in small difference y−Ad are visited more frequently as discussed generally above.

In accordance with one embodiment of the present invention, to draw $b_k^{(n)}$ in the Gibbs sampler, the distribution $P(b_k|b_1^{(n)}, \ldots, b_{k-1}^{(n)}, b_{k+1}^{(n-1)}, \ldots, b_{KM}^{(n-1)}, y, \lambda_2^e)$ is obtained, i.e., $P(b_k=+1|b_1^{(n)}, \ldots, b_{k-1}^{(n)}, b_{k+1}^{(n-1)}, \ldots, b_{KM}^{(n-1)}, y, \lambda_2^e)$ and $P(b_k=-1|b_1^{(n)}, \ldots, b_{k-1}^{(n)}, b_{k+1}^{(n-1)}, \ldots, b_{KM}^{(n-1)}, y, \lambda_2^e)$. To derive equations for these probabilities, define $$b_{-k}^{(n)} \triangleq [b_1^{(n)} \ldots b_{k-1}^{(n)} b_{k+1}^{(n-1)} \ldots, b_{KM}^{(n-1)}]^T \qquad (30)$$

and note that (31)

$$P(b_k = +1 \mid y, b_{-k}^{(n)}, \lambda_2^e) = \frac{P(b_k = +1 \mid y, b_{-k}^{(n)}, \lambda_2^e)}{P(b_k = +1 \mid y, b_{-k}^{(n)}, \lambda_2^e) + P(b_k = -1 \mid y, b_{-k}^{(n)}, \lambda_2^e)}$$

since the summation in the denominator is equal to one. In (31) and other equations that follow, $b_{-k}^{(n)}$ is the short hand notation for $b_{-k}=b_{-k}^{(n)}$. Note also that $$P(b_k = +1 \mid y, b_{-k}^{(n)}, \lambda_2^e) = \frac{p(y \mid b_{k^+}^{(n)}, \lambda_2^e) P(b_{k^+}^{(n)} \mid \lambda_2^e)}{p(y \mid b_{-k}^{(n)}, \lambda_2^e)} \qquad (32)$$

$b_{k^+}^{(n)}=[b_1^{(n)} \ldots b_{k-1}^{(n)}, +1, b_{k+1}^{(n-1)} \ldots b_{KM}^{(n-1)}]^T$. Also define $b_{k^-}=[b_1^{(n)} \ldots b_{k-1}^{(n)}, -1, b_{k+1}^{(n-1)} \ldots b_{KM}^{(n-1)}]^T$. Noting that $p(y|b_{k^+}^{(n)},\lambda_2^e)=p(y|b_{k^+}^{(n)})$, since when the data vector b is fully specified the extrinsic information become irrelevant, and substituting (32) in (31), after deleting the common terms, $$P(b_k = +1 \mid y, b_{-k}^{(n)}, \lambda_2^e) = \qquad (33)$$
$$\frac{p(y \mid b_{k^+}^{(n)}) P^e(b_k = +1)}{p(y \mid b_{k^+}^{(n)}) P^e(b_k = +1) + p(y \mid b_{k^-}^{(n)}) P^e(b_k = -1)}$$

where $P^e(b_k = i) \triangleq P(b_k = i \mid \lambda_2^e(b_k))$, for $i = \pm 1$, and the elements of b can be assumed independent of each other, hence, $P(b_{k^+}^{(n)}|\lambda_2^e) = P^e(b_1=b_1^{(n)}) \ldots P^e(b_{k-1}=b_{k-1}^{(n)}) P^e(b_k=+1) P^e(b_{k+1}=b_{k+1}^{(n-1)}) \ldots P^e(b_{KM}=b_{KM}^{(n-1)})$. (34)

When A is known (or has been estimated) and the noise vector n is Gaussian and satisfies $$E[nn^H] = \frac{1}{2}\sigma_n^2 I, \qquad (35)$$
$$p(y|b_{k^+}^{(n)}) = \frac{1}{(\pi\sigma_n^2)^{N/2}} e^{-\|y-Ad_{k^+}^{(n)}\|^2/\sigma_n^2},$$

where $d_{k^+}^{(n)}$ is the vector of transmit symbols obtained through mapping from $b_{k^+}^{(n)}$. Although direct substitution of (35) and a similar equation with $b_{k^+}^{(n)}$ replaced by $b_{k^-}^{(n)}$ in (33) can be done, the result is computationally involved and may be sensitive to numerical errors procedure. Hence, a log-domain implementation is preferable as will now be described.

Defining $$\gamma_{k^+} \triangleq \ln(P^e(b_k = +1)) - \frac{\|y - Ad_{k^+}^{(n)}\|^2}{\sigma_n^2} \qquad (36)$$

and $$\gamma_{k^-} \triangleq \ln(P^e(b_k = -1)) - \frac{\|y - Ad_{k^-}^{(n)}\|^2}{\sigma_n^2} \qquad (37)$$

(33) may be rearranged as $$P(b_k = +1|y, b_{-k}^{(n)}, \lambda_2^e) = \frac{1}{1 + e^{-(\gamma_{k^+} - \gamma_{k^-})}}. \qquad (38)$$

Using (36) and (37), to obtain $$\gamma_{k^+} - \gamma_{k^-} = \lambda_2^e(b_k) - \frac{\|y - Ad_{k^+}^{(n)}\|^2 - \|y - Ad_{k^-}^{(n)}\|^2}{\sigma_n^2} \qquad (39)$$

where $$\lambda_2^e(b_k) = \ln\frac{P^e(b_k = +1)}{P^e(b_k = -1)}.$$

Noting that $d_{k^+}^{(n)}$ and $d_{k^-}^{(n)}$ differ in one term, straightforward manipulations lead to $$\gamma_{k^+} - \gamma_{k^-} = \lambda_2^e(b_k) - \frac{1}{\sigma_n^2}\left((d_{k^+,p}^{(n)})^2 - (d_{k^-,p}^{(n)})^2\right)r_{pp} + \frac{2}{\sigma_n^2}(d_{k^+,p}^{(n)} - d_{k^-,p}^{(n)})\left(y_p^{mf} - \sum_{q=1,q\neq p}^{K} r_{pq}d_q^{(n)}\right) \quad (40)$$

where $y_p^{mf} = a_p^T y$, $r_{pq}$ is the pq th element of $R = A^T A$, $d_q^{(n)}$ is the q th element of $d^{(n)}$, $d_{k^+,p}^{(n)}$ and $d_{k^-,p}^{(n)}$ are the p th element of $d_{k^+}^{(n)}$ and $d_{k^-}^{(n)}$, respectively, and $b_k$ is mapped to $d_p^{(n)}$. Note that $d_q^{(n)}$, depends on $b_k$ when q=p, and the above notation reflects this fact. Equation (40) may be further rearranged as $$\gamma_{k^+} - \gamma_{k^-} = \lambda_2^e(b_k) - \kappa_1 r'_{pp} + \kappa_2\left(y_p^{'mf} - \sum_{q=1,q\neq p}^{K} r'_{pq}d_q^{(n)}\right) \quad (41)$$

where $$\kappa_1 = \frac{1}{2}\left((d_{k^+,p}^{(n)})^2 - (d_{k^-,p}^{(n)})^2\right),\ \kappa_2 = (d_{k^+,p}^{(n)} - d_{k^-,p}^{(n)}),$$

$$y_p^{'mf} = \frac{2}{\sigma_n^2}y_p^{mf}$$

and $$r'_{pq} = \frac{2}{\sigma_n^2}r_{pq}.$$

Hence, $y'_p{}^{mf}$ and $r'_{pq}$ can be pre-calculated prior to starting the Gibbs sampler and thus be provided as inputs to it.

When transmitted symbols are QPSK, d=b, $d_{k^+,p}^{(n)}$=+1 and $d_{k^-,p}^{(n)}$=−1, and accordingly (41) reduces to $$\gamma_{k^+} - \gamma_{k^-} = \lambda_2^e(b_k) + 2\left(y_p^{'mf} - \sum_{q=1,q\neq p}^{K} r'_{pq}b_q^{(n)}\right). \quad (42)$$

Moreover, since $b_q^{(n)}$'s are binary, evaluation of the right-hand side of (42) involves primarily additions and subtractions.

In the case of more complex modulations, such as QAM, evaluation of (41) is naturally more involved. However, since $d_q^{(n)}$'s are from a relatively small alphabet, an add/subtract implementation is still feasible.

Evaluation of (38) involves a function of the form $1/(1+e^x)$. Various approaches for implementing this function in hardware are possible, including using a lookup table or using the linear approximation:

$$\frac{1}{1+e^{-x}} \approx \frac{x}{2^3} + \frac{1}{2} \quad (43)$$

When this approximation is used, it is possible that the evaluated value of $P(b_k=+1|y,b_{-k}^{(n)},\lambda_2^e)$ exceeds one or becomes negative. When this happens, $P(d_k=+1|y,b_{-k}^{(n)},\lambda_2^e)$ may be hard limited to the maximum and minimum values of 1 and 0, respectively.

Using (24) above, $$\lambda_1^e(b_k) = \ln\frac{\sum_{n=1}^{N_s} p(y|b_{-k}^{(n)}, b_k=+1)P^e(b_{-k}^{(n)})}{\sum_{n=1}^{N_s} p(y|b_{-k}^{(n)}, d_k=-1)P^e(b_{-k}^{(n)})} \quad (44)$$

where $$P^e(b_{-k}^{(n)}) = P^e(b_1=b_1^{(n)})\ldots P^e(b_{k-1}=b_{k-1}^{(n)})P^e(b_{k+1}=b_{k+1}^{(n-1)})\ldots P^e(b_{KM}=b_{KM}^{(n-1)}) \quad (45)$$

To ensure that the samples $b^{(n)}$ are different, repetitions of $b^{(n)}$ may be deleted while running the Gibbs sampler. An efficient implementation can be developed by defining $$\eta_{k^+}^{(n)} \triangleq \ln P^e(b_{-k}^{(n)}) - \frac{\|y - Ad_{k^+}^{(n)}\|^2}{\sigma_n^2} \quad (46)$$

and $$\eta_{k^-}^{(n)} \triangleq \ln P^e(b_{-k}^{(n)}) - \frac{\|y - Ad_{k^-}^{(n)}\|^2}{\sigma_n^2} \quad (47)$$

and noting that (44) can be rearranged as $$\lambda_1^e(b_k) = \ln\left(\sum_{n=1}^{N_s} e^{\eta_{k^+}^{(n)}}\right) - \ln\left(\sum_{n=1}^{N_s} e^{\eta_{k^-}^{(n)}}\right). \quad (48)$$

Additional simplification can be obtained using the definition $$\max{}^*(x, y) = \max(x, y) + \ln(1 + e^{-|x-y|}), \quad (49)$$

where $\max{}^*(x, y) \triangleq \ln(e^x + e^y)$, and its recursive extension $$\max{}^*(x, y, z) = \max{}^*[\max{}^*(x, y), z], \quad (50)$$

where $\max{}^*(x, y, z) \triangleq \ln(e^x + e^y + e^z)$.

Computation of $\ln(1+e^{-|x-y|})$ may be done through the use of a small look-up table. Alternately, the approximation $$\lambda_1^e(b_k) \approx \max_n \eta_{k^+}^{(n)} - \max_n \eta_{k^-}^{(n)}. \quad (51)$$

can be used. This approximation significantly simplifies the implementation of the detector. In (48), each new sample of b is to be compared with the previous elements and deleted if it is a repeat sample. When $N_s$ is large this may be a complexity burden. Implementation of (51), in contrast, is relatively simple. As samples b are generated, the respective values $\eta_{k^+}^{(n)}$ and $\eta_{k^-}^{(n)}$ are computed. Each of these are then compared their counterpart from the previous Gibbs samples, i.e., with $\eta_{k^+}^{(n-1)}$ and $\eta_{k^-}^{(n-1)}$, respectively, and replaced if they are larger or discarded if they are smaller. This also avoids the need to search for repetitions of b; a significant savings since the number of comparisons needed for deleting repetitions grows with the square of $N_s$.

An intermediate solution that also avoids the complexity burden of (48), while still performing better than (51) is to keep a few of the largest samples of $\eta_{k+}^{(n)}$ and $\eta_{k-}^{(n)}$ for application in an equation similar to (48). Implementation of these results in circuit form will now be presented.

Figure 6:
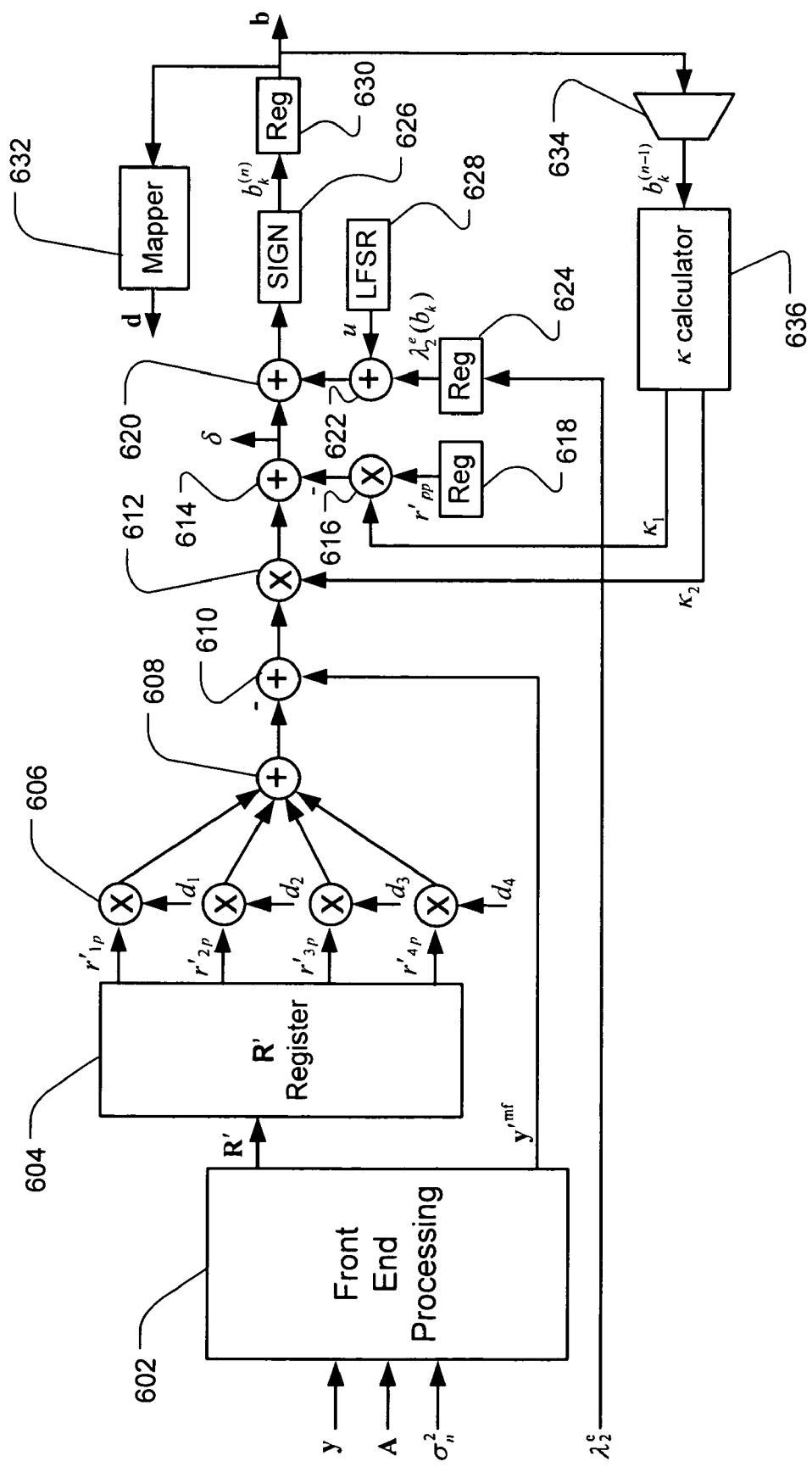
FIG. 6 is a block diagram of a Gibbs sampler circuit in accordance with an embodiment of the present invention.

FIG. 6 illustrates a Gibbs sampler, in accordance with an embodiment of the present invention. The Gibbs sampler includes front-end processing 602. The front-end processing takes y, A and $\sigma_n^2$ as inputs and calculates $y'^{mf}$ and $$R' = \frac{2}{\sigma_n^2} R.$$

The channel response, A and noise variance $\sigma_n^2$, may be known or may be estimated by the receiver using various known techniques.

Substituting (41) in (43), $$P(b_k = +1 \mid y, b_{-k}^{(n)}, \lambda_2^e) \approx \qquad (52)$$

$$\frac{\lambda_2^e(b_k) - \kappa_1 r'_{pp} + \kappa_2 \left( y_p^{mf} - \sum_{q=1, q \neq p}^{K} r'_{pq} d_q^{(n)} \right)}{2^3} + \frac{1}{2}.$$

In the Gibbs sampler 504, the next choice of $b_k$ is made by selecting $b_k = +1$ with the probability $P(b_k = +1 \mid y, b_{-k}^{(n)}, \lambda_2^e)$. To realize this in hardware, a random variable, v, with uniform distribution in the interval 0 to 1 may be generated, and $b_k$ is set equal to +1 if $P(b_k = +1 \mid y, b_{-k}^{(n)}, \lambda_2^e) - v > 0$, otherwise $b_k$ is set equal to $-1$. Alternatively, and more conveniently here, the latter inequality can be written as $2^3(P(b_k = +1 \mid y, b_{-k}^{(n)}, \lambda_2^e) - 0.5) - u > 0$, where $u = 2^3(v - 0.5)$ is a random variable with uniform distribution in the interval $-4$ to $+4$. The random variable u can be easily generated using a linear feedback shift register (LFSR) circuit 628. Various LFSR circuit implementations can be used.

The R' register 604 stores a matrix of elements $r'_{pq}$. The diagonal elements of R' are forced to zero in order to exclude the case q=p as motivated by (52). Since in practice $d_i$'s are from a small alphabet and accordingly the number of possible values of $\kappa_1$ and $\kappa_2$ are small, each multiplier 606, 612, 616 can optionally be implemented by add/subtract operations. Hence, the Gibbs sampler can be implemented in a multiplier-free realization. The rest of the operation of the Gibbs sampler thus follows from (52).

Computation of L-values is done according to (46), (47) and (51) by applying various approximations. Although, here, to simplify the discussion, use of (51) is emphasized, the developed circuit, with minor modification, is also applicable to (48).

From (46) and (47), note that the computation of $\eta_{k+}^{(n)}$ and $\eta_{k-}^{(n)}$ requires computation of $\ln P^e(b_{-k}^{(n)})$ and $$\frac{\|y - Ad^{(n)}\|^2}{\sigma_n^2}.$$

Continuing with the description of procedures for computation of these terms, note that $$\lambda_2^e(b_k) = \ln \frac{P^e(b_k = +1)}{P^e(b_k = -1)} = \ln \frac{P^e(b_k = +1)}{1 - P^e(b_k = +1)}$$

and using this obtain, for $i = \pm 1$, $$\ln P^e(b_k = i) = \ln \frac{1}{1 + e^{-i\lambda_2^e(b_k)}} \qquad (53)$$

$$= -\max^* (0, -i\lambda_2^e(b_k))$$

$$\approx -\max(0, -i\lambda_2^e(b_k))$$

$$= \min(0, i\lambda_2^e(b_k)).$$

Using (53) and $\psi_k^{(n)}$ as an approximation to $\ln P^e(b_k^{(n)})$, where $b_k^{(n)} = [b_1^{(n)} \ldots b_k^{(n)} b_{k+1}^{(n-1)} \ldots b_{KM}^{(n-1)}]^T$, and noting that because of the interleaving effect the information bits are independent, $$\psi_k^{(n)} = \sum_{l=1}^{k} \min(0, b_l^{(n)} \lambda_2^e(b_k)) + \sum_{l=k+1}^{KM} \min(0, b_l^{(n-1)} \lambda_2^e(b_k)). \qquad (54)$$

Using (54), $\psi_k^{(n)}$ can be updated according to the following rule:

if $b_k^{(n)} \neq b_k^{(n-1)}$ then $\psi_k^{(n)} = \psi_k^{(n-1)} - b_k^{(n-1)} \lambda_2^e(b_k)$ else $\psi_k^{(n)} = \psi_k^{(n-1)}$.

Note that $\psi_k^{(n)} = \psi_k^{(n-1)} - \min(0, b_k^{(n-1)} \lambda_2^e(b_k)) + \min(0, b_k^{(n)} \lambda_2^e(b_k))$, which can be simplified to $$\psi_k^{(n)} = \psi_k^{(n-1)} - b_k^{(n-1)} \lambda_2^e(b_k) \qquad (55)$$

when $b_k^{(n)} \neq b_k^{(n-1)}$. Once $\psi_k^{(n)}$ is available, $\ln P^e(b_{-k}^{(n)})$ can be calculated by removing the contribution of $b_k^{(n)}$, viz.

$$\ln P^e(b_{-k}^{(n)}) = \psi_k^{(n)} + \max(0, b_k^{(n)} \lambda_2^e(b_k)). \qquad (56)$$

FIG. 7 illustrates a $\psi$-calculator circuit 700 based on the above result, in accordance with an embodiment of the present invention. When $b_k^{(n)} \neq b_k^{(n-1)}$, the $\psi$ register 702 is enabled and its content is updated according to (54) using summer 704 for calculate the new value. Following (55), $\ln P^e(b_{-k}^{(n)})$ is determined by the present content of $\psi$ register, when $b_k^{(n-1)} \lambda_2^e(b_k)$ is positive, or by the updated $\psi$, when $b_k^{(n-1)} \lambda_2^e(b_k)$ is negative by selecting the appropriate resulting using a multiplexer 706 (or alternately, multiplexer 706 may be implemented by a switch) controlled by a sign bit extractor 708. Note that $\psi$ is insensitive to a bias since the subtraction of the two terms on the right-hand side of (51) (and also (48)) removes such a bias. Hence, $\psi$ can be assigned essentially any arbitrary initial value.

Next, a circuit for computation of $$\frac{\|y - Ad_k^{(n)}\|^2}{\sigma_n^2} \text{ and } \frac{\|y - Ad_k^{(n)}\|^2}{\sigma_n^2}$$

is described. Let $$\zeta_{k+}^{(n)} = \frac{\|y - Ad_{k+}^{(n)}\|^2}{\sigma_n^2}$$

and $$\xi_k^{(n)} = \frac{\|y - Ad_k^{(n)}\|^2}{\sigma_n^2}$$

and note that the difference $\xi_{k^+}^{(n)} - \xi_{k^-}^{(n)} = \delta$ is available from the Gibbs sampler. Accordingly, updating $\xi_{k^+}^{(n)}$ and $\xi_{k^-}^{(n)}$ may be performed according to the rule:

if $b_k^{(n)} \neq b_k^{(n-1)}$ if $b_k^{(n)} = +1$ $\xi_{k^+}^{(n)} = \xi + \delta; \xi_{k^-}^{(n)} = \xi; \xi = \xi + \delta$ else $\xi_{k^+}^{(n)} = \xi; \xi_{k^-}^{(n)} = \xi - \delta; \xi = \xi - \delta$ else if $b_k^{(n)} = +1$ $\xi_{k^+}^{(n)} = \xi; \xi_{k^-}^{(n)} = \xi - \delta$ else $\xi_{k^+}^{(n)} = \xi + \delta; \xi_{k^-}^{(n)} = \xi$ Here, $\xi$ is an auxiliary variable that helps with the implementation of the procedure. FIG. 8 illustrates $\xi$-calculator circuit to calculate $\xi$, in accordance with an embodiment of the present invention. The content of the $\xi$ register 802 is updated whenever $b_k^{(n)} \neq b_k^{(n-1)}$. It is updated to the value of $\xi + \delta$ (computed by adder 804) when $b_k^{(n)} = +1$ and to the value of $\xi - \delta$ when $b_k^{(n)} = -1$.

Finally, a log-likelihood calculator circuit for computing the LLR values is shown in FIG. 9 in accordance with an embodiment of the present invention. The log-likelihood calculator 900 uses the $\xi$-calculator circuit 800 and $\psi$-calculator circuit 700. The log-likelihood calculator implements (51).

As shown above, one step of the Gibbs sampler uses one clock cycle. Hence one cycle of the Gibbs samplers use KM clock cycles to execute. In previously known MCMC simulation, the content of b is considered as a sample of the Markov chain at the end of each iteration of the Gibbs sampler. In contrast, here the transitional samples $b_k^{(n)} = [b_1^{(n)} \ldots b_k^{(n)} b_{k+1}^{(n-1)} \ldots b_{KM}^{(n-1)}]^T$ are used. This modification reduces the hardware complexity and increases the speed of operation of the circuit. This modification appears to result in minor impact on the receiver performance.

The above illustrated circuits may include pipelining to increase throughput. For example, a buffer can be placed after the adders. Similarly, the multipliers can also be implemented using a combination of adders and subtractors, with pipelining. Accordingly, the clock rate of the circuit can be increased to a rate where one addition is performed each clock period. Of course, it will be recognized that additional delays may be used in order to time align various parameters. For example, the b values may be delayed in order to ensure they time-correspond to values of δ, which have longer pipeline delays in their computation.

A pipelined implementation will introduce a delay in the Gibbs sampler circuit, resulting in the Gibbs sampler drawing samples $b_k^{(n)}$ from the distribution $P(b_k | b_1^{(n)}, \ldots, b_{k-\Delta-1}^{(n)}, \ldots, b_{k-\Delta}^{(n-1)}, \ldots, b_{k-1}^{(n-1)}, b_{k+1}^{(n-1)}, \ldots, b_{KM}^{(n-1)}, y, \lambda_2^e)$ rather than the initially discussed distribution $P(b_k | b_1^{(n)}, \ldots, b_{k-1}^{(n)}, b_{k+1}^{(n-1)}, \ldots, b_{KM}^{(n-1)}, y, \lambda_2^e)$. This does not appear to have an appreciable impact of the performance of the detector.

Yet another method of pipelining is possible by running a few parallel Gibbs samplers on a common circuit. The parallel Gibbs samplers share a common computational circuit similar to the one shown in FIG. 6, and the data for each Gibbs sampler is stored in a separate memory. As the circuit runs, the information for each Gibbs sampler is accessed from the corresponding memory, in turn, and the results are put back in the memory after each operation. In other words, information from different Gibbs samplers are time multiplexed and processed on a common circuit. This implementation gives a circuit that performs similarly to a number of independent parallel Gibbs samplers without any buffering delay, yet using a common computational block. This implementation has no performance loss due to buffering, yet operates at a speed similar to the method of pipelining that was mentioned in the previous paragraph.

Similar buffering techniques are applicable to the rest of the detector circuits; namely to the $\psi$-calculator circuit, the $\xi$-calculator circuit, and the log-likelihood calculator circuit.

In summary, efficient hardware implementations of the detector using add, subtract and compare operations are illustrated. Such implementations are amenable to pipelining to increase the clock speed of operation. Additional benefits of the implementation are relatively small word lengths (e.g. 8 to 12 bit precision). Although the above has been described with particular reference to digital components, e.g. as implemented in an application specific integrated circuit or field programmable gate array, it is to be understood that the circuits can equally be implemented using a general purpose processor or digital signal processor.

Finally, it is noted that the mathematical derivation of operation of the presently disclosed inventive techniques made certain assumptions, e.g. Gaussian white noise and independent data. These assumptions are not essential to the operation of the disclosed embodiments, as excellent performance can be obtained in many situations which do not exactly fit these mathematical assumptions.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein. Accordingly, it is not intended that the scope of the invention be limited excepted by the claims set forth below

What is claimed is:

1. A method for estimating channel data bit probabilities of a multi-channel signal received through a communication channel, comprising:
   summing a conditional bit probability conditioned on an observation of the multi-channel signal and a hypothetical channel data pattern by summing over a subset of hypothetical channel data patterns to obtain a channel data bit probability summation;
   generating the subset of hypothetical channel data patterns using a plurality of Markov chain Monte Carlo simulations to stochastically select the subset of hypothetical channel data patterns corresponding to dominant conditional bit probability terms in the channel data bit probability summation; and initializing the plurality of Markov chain Monte Carlo simulations with a plurality of different starting states, wherein the starting state of at least a first one of the plurality of Markov chain Monte Carlo simulations is selected using a first selection approach and the starting state of at least a second one of the plurality of Markov chain Monte Carlo simulations is selected using a second selection approach which is different than the first selection approach.

2. The method of claim 1, wherein the first selection approach comprises:
selecting a random channel data pattern; and
setting the starting state equal to the random channel data pattern.

3. The method of claim 1, wherein the first selection approach comprises:
estimating a channel data pattern from the observation of the multi-channel signal to form an estimated channel data pattern; and
setting the starting state equal to the estimated channel data pattern.

4. The method of claim 3, wherein estimating the channel data pattern comprises detecting the estimated channel data pattern using a receiver selected from the group of receivers consisting of a zero forcing equalizer, a minimum mean square error equalizer, and a successive interference canceller.

5. The method of claim 1 further comprising forming a log likelihood ratio estimate from the channel data bit probability summation.

6. The method of claim 1 wherein the communication channel is a code division multiple access channel.

7. The method of claim 1 wherein the communication channel is a multiple input multiple output channel.

8. The method of claim 1 further comprising using at least a plurality of first hypothetical channel data patterns in the channel data bit probability summation, the plurality of first hypothetical channel data patterns corresponding to the plurality of different starting states.

9. A detector for estimating channel data probabilities in a multi-channel communication system comprising:
a receiver configured to receive a multi-channel signal and output an observed signal;
at least one initial data estimator coupled to the receiver and configured to generate at least one initial channel data estimate from the observed signal;
a plurality of Gibbs samplers coupled to the receiver and configured to generate stochastically selected channel data hypotheses based in part on the observed signal and a channel model wherein at least one of the plurality of Gibbs samplers is initialized using the at least one initial data estimate; and
a channel data probability estimator coupled to the receiver and coupled to the plurality of Gibbs samplers and configured to estimate channel data probabilities from the observed signal and the stochastically selected channel data hypotheses.

10. The detector of claim 9 wherein each of the plurality of Gibbs samplers comprises a Gibbs sampler circuit.

11. The detector of claim 9 wherein at least one of the plurality of Gibbs samplers is initialized using a random initial data estimate.

12. The detector of claim 9 wherein the at least one initial data estimator comprises a receiver selected from the group of receivers consisting of a zero forcing equalizer, a minimum mean square error equalizer, and a successive interference canceller.

13. The detector of claim 9 wherein the at least one initial data estimator comprises a first receiver and a second receiver, each selected from the group of receivers consisting of a zero forcing equalizer, a minimum mean square error equalizer, and a successive interference canceller, the first receiver being different from the second receiver.

14. A detector for estimating channel data probabilities in a multi-channel communication system from a multi-channel signal received through a communication channel, comprising:
means for summing a conditional bit probability conditioned on an observation of the multi-channel signal and a hypothetical channel data pattern by summing over a subset of hypothetical channel data patterns to obtain a channel data bit probability summation;
means for generating the subset of hypothetical channel data patterns using a plurality of Markov chain Monte Carlo simulations to stochastically select the subset of hypothetical channel data patterns corresponding to dominant conditional bit probability terms in the channel data bit probability summation; and
means for initializing the plurality of Markov chain Monte Carlo simulations with a plurality of different starting states, wherein the starting state of at least a first one of the plurality of Markov chain Monte Carlo simulations is selected using a first selection approach and the starting state of at least a second one of the plurality of Markov chain Monte Carlo simulations is selected using a second selection approach which is different than the first selection approach.

15. The detector of claim 14 wherein the first selection approach comprises means for estimating a channel data pattern and the second selection approach comprises means for randomly selecting a channel data pattern.

16. The detector of claim 15, wherein the means for estimating the channel data pattern comprises a receiver selected from the group of receivers consisting of a zero forcing equalizer, a minimum mean square error equalizer, and a successive interference canceller.

17. The detector of claim 14 further comprising means for forming a log likelihood ratio estimate from the channel data bit probability summation.

18. The detector of claim 14 wherein the communication channel is chosen from the group consisting of a code division multiple access channel and a multiple input multiple output channel.

* * * * *